US006400743B1

(12) United States Patent
Fukunaga et al.

(10) Patent No.: US 6,400,743 B1
(45) Date of Patent: Jun. 4, 2002

(54) HIGH-POWER SEMICONDUCTOR LASER DEVICE HAVING CURRENT CONFINEMENT STRUCTURE AND INDEX-GUIDED STRUCTURE

(75) Inventors: Toshiaki Fukunaga; Mitsugu Wada, both of Kaisei-machi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 114 days.

(21) Appl. No.: 09/634,703

(22) Filed: Aug. 7, 2000

(30) Foreign Application Priority Data

Aug. 5, 1999 (JP) .......................... 11-222168
Aug. 5, 1999 (JP) .......................... 11-222169

(51) Int. Cl.[7] .................................. H01S 5/00
(52) U.S. Cl. ........................... 372/46; 372/45
(58) Field of Search .................... 372/45, 46

(56) References Cited

U.S. PATENT DOCUMENTS

| | | | | |
|---|---|---|---|---|
| 4,567,060 A | * | 1/1986 | Hayakawa et al. | 372/46 |
| 4,999,841 A | * | 3/1991 | Sakiyama et al. | 372/45 |
| 5,058,120 A | * | 10/1991 | Nitta et al. | 372/46 |
| 5,361,271 A | * | 11/1994 | Takiguchi et al. | 372/46 |
| 5,446,753 A | * | 8/1995 | Yoshida | 372/46 |
| 5,566,198 A | * | 10/1996 | Horie et al. | 372/46 |
| 5,933,443 A | * | 8/1999 | Mushiage et al. | 372/46 |

OTHER PUBLICATIONS

Shima, Akihiro et al., "0.78–and 0–98–μm Ridge–Waveguide Lasers Buried with AIGaAs Confinement Layer Selectively Grown by Chloride–Assisted MOCVD", IEEE Journal of Selected Topics in Quantum Electronics, vol. 1, No. 2, Jun. 1995. pp. 102–109.

Ishikawa, Shin et al., "0–98–1.02 μm Strained InGaAs Double Quantum–Well High–Power Lasers with GaInP Buried Waveguides" IEEE Journal of Quantum Electronics, vol. 29, No. 6, Jun. 1993, pp. 1936–1942.

Sagawa, M. et al., "High–Power Highly–Reliable Operation of 0.98–μm InGaAs–InGaP Strain–Compensated Single–Quantum–Well Lasers with Tensile–Strained InGaAsP Barries", IEEE Journal of Selected Topics in Quantum Electronics, vol. 1, No. 2, Jun. 1995, pp. 189–194.

Imafuji, Osamu et al., "600 mW CW Single–Mode GaAlAs Triple–Quantum–Well Laser with a New Index Guided Structure", IEEE Journal of Quantum Electronics, vol. 29, No. 6, Jun. 1993, pp. 1889–1894.

Fujimoto. T. et al., "High Power InGaAs/AIGaAs laser diodes with decoupled confinement heterostructure" SPIE Conference on In–Plane Semiconductor Lasers III, San Jose, California, Jan. 1999, SPIE vol. 3628 pp. 38–45.

* cited by examiner

Primary Examiner—Quyen Leung
(74) Attorney, Agent, or Firm—Sughrue Mion, PLLC

(57) ABSTRACT

In a semiconductor laser device: an n-type lower cladding layer; a lower optical waveguide layer; a compressive strain quantum well active layer made of $In_{x3}Ga_{1-x3}As_{1-y3}P_{y3}$, where $0<x3\leq 0.4$ and $0\leq y3\leq 0.1$; an upper optical waveguide layer; a p-type $In_{0.49}Ga_{0.51}P$ first upper cladding layer; an etching stop layer made of $In_{x1}Ga_{1-x1}As_{1-y3}P_{y1}$, where $0\leq x1\leq 0.3$ and $0\leq y1\leq 0.6$; an n-type $In_{0.49}Ga_{0.51}P$ current confinement layer; a p-type second upper cladding layer made of $In_{x4}Ga_{1-x4}As_{1-y4}P_{y4}$, where $x4=(0.49\pm 0.01)y4$ and $0.4\leq x4\leq 0.46$; and a p-type contact layer are formed on an n-type GaAs substrate in this order. At least the current confinement layer has a stripe-shape opening realizing a current injection window filled with the second upper cladding layer. The absolute value of the product of the strain and the thickness of the compressive strain quantum well active layer is equal to or smaller than 0.25 nm; the absolute value of the product of the strain and the thickness of the etching stop layer is equal to or smaller than 0.25 nm; and each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

64 Claims, 8 Drawing Sheets

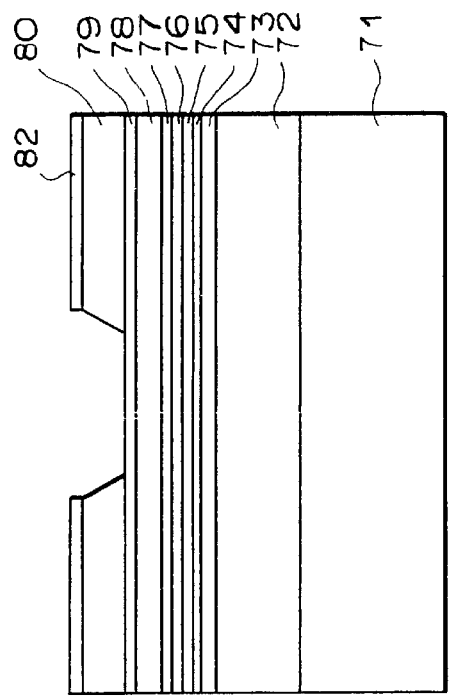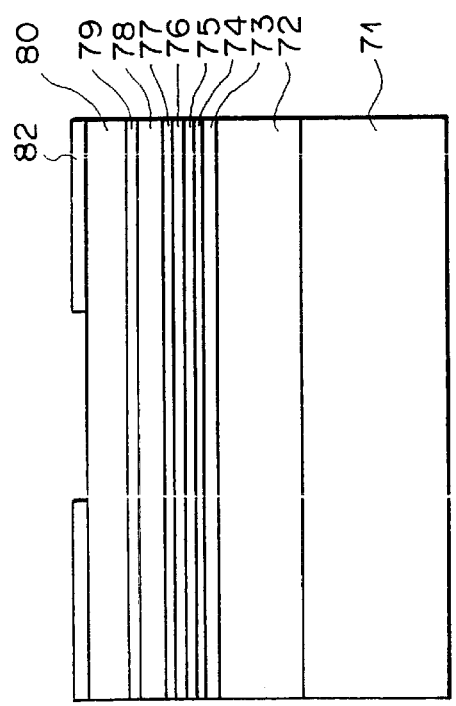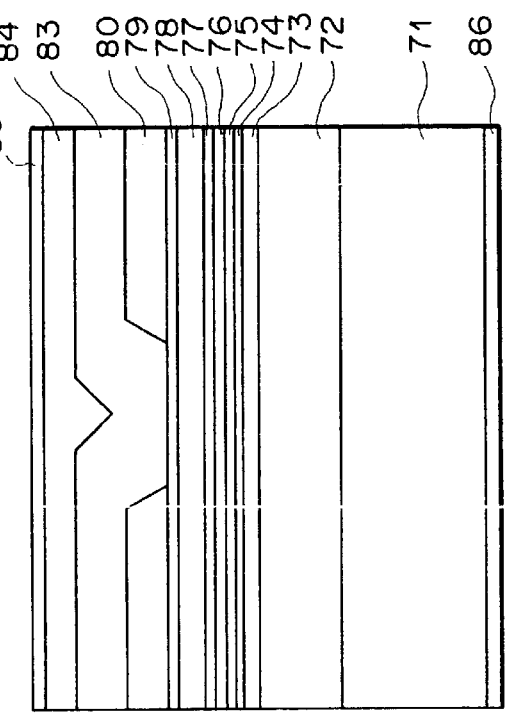

HIGH-POWER SEMICONDUCTOR LASER DEVICE HAVING CURRENT CONFINEMENT STRUCTURE AND INDEX-GUIDED STRUCTURE

BACKGROUND OF THE INVENTION

1. Field of the Invention

The present invention relates to a semiconductor laser device having a current confinement structure and an index-guided structure, and a process for producing a u semiconductor light emitting device having a current confinement structure and an index-guided structure.

2. Description of the Related Art (1) In many conventional current semiconductor laser devices which emit light in the 0.9 to 1.1 $\mu$m band, a current confinement structure and index-guided structure are provided in crystal layers which constitute the semiconductor laser devices so that the semiconductor laser device oscillates in a fundamental transverse mode. For example, IEEE Journal of Selected Topics in Quantum Electronics, vol. 1, No. 2, 1995, pp.102 discloses a semiconductor laser device which emits light in the 0.98 $\mu$m band. This semiconductor laser device is formed as follows.

On an n-type GaAs substrate, an n-type $Al_{0.48}Ga_{0.52}As$ lower cladding layer, an undoped $Al_{0.2}Ga_{0.8}As$ optical waveguide layer, an $Al_{0.2}Ga_{0.8}As/In_{0.2}Ga_{0.8}As$ double quantum well active layer, an undoped $Al_{0.2}Ga_{0.8}As$ optical waveguide layer, a p-type AlGaAs first upper cladding layer, a p-type $Al_{0.67}Ga_{0.33}As$ etching stop layer, a p-type $Al_{0.48}Ga_{0.52}As$ second upper cladding layer, a p-type GaAs cap layer, and an insulation film are formed in this order. Next, a narrow-stripe ridge structure is formed above the p-type $Al_{0.67}Ga_{0.33}As$ etching stop layer by normal photolithography and selective etching, and n-type $Al_{0.7}Ga_{0.3}As$ and n-type GaAs materials are embedded in both sides of the ridge structure by selective MOCVD using Cl gas. Then, the insulation film is removed, and thereafter a p-type GaAs layer is formed. Thus, a current confinement structure and an index-guided structure are built in the semiconductor laser device.

However, the above semiconductor laser device has a drawback that it is very difficult to form the AlGaAs second upper cladding layer on the AlGaAs first upper cladding layer, since the AlGaAs first upper cladding layer contains a high Al content and is prone to oxidation, and selective growth of the AlGaAs second upper cladding layer is difficult.

(2) In addition, IEEE Journal of Quantum Electronics, vol. 29, No. 6, 1993, pp.1936 discloses a semiconductor laser device which oscillates in a fundamental transverse mode, and emits light in the 0.98 to 1.02 $\mu$m band. This semiconductor laser device is formed as follows.

On an n-type GaAs substrate, an n-type $Al_{0.4}Ga_{0.6}As$ lower cladding layer, an undoped $Al_{0.2}Ga_{0.8}As$ optical waveguide layer, a GaAs/InGaAs double quantum well active layer, an undoped $Al_{0.2}Ga_{0.8}As$ optical waveguide layer, a p-type $Al_{0.4}Ga_{0.6}As$ upper cladding layer, a p-type GaAs cap layer, and an insulation film are formed in this order. Next, a narrow-stripe ridge structure is formed above a mid-thickness of the p-type $Al_{0.4}Ga_{0.6}As$ upper cladding layer by normal photolithography and selective etching, and an n-type $In_{0.5}Ga_{0.5}P$ material and an n-type GaAs material are embedded in both sides of the ridge structure by selective MOCVD. Finally, the insulation film is removed, and then electrodes are formed. Thus, a current confinement structure and an index-guided structure are realized in the layered construction.

However, the above semiconductor laser device also has a drawback that it is very difficult to form the InGaP layer on the AlGaAs upper cladding layer, since the AlGaAs upper cladding layer contains a high Al content and is prone to oxidation, and it is difficult to grow an InGaP layer having different V-group component, on such an upper cladding layer.

(3) Further, IEEE Journal of Selected Topics in Quantum Electronics, vol. 1, No. 2, 1995, pp.189 discloses an all-layer-Aluminum-free semiconductor laser device which oscillates in a fundamental transverse mode, and emits light in the 0.98 $\mu$m band. This semiconductor laser device is formed as follows.

On an n-type GaAs substrate, an n-type InGaP cladding layer, an undoped InGaAsP optical waveguide layer, an InGaAsP tensile strain barrier layer, an InGaAs double quantum well active layer, an InGaAsP tensile strain barrier layer, an undoped InGaAsP optical waveguide layer, a p-type InGaP first upper cladding layer, a p-type GaAs optical waveguide layer, a p-type ten InGaP second upper cladding layer, a p-type GaAs cap layer, and an insulation film are formed in this order. Next, a narrow-stripe ridge structure is formed above or the p-type InGaP first upper cladding layer by normal photolithography and selective etching, and an n-type $In_{0.5}Ga_{0.5}P$ material is embedded in both sides of the ridge structure by selective MOCVD. Finally, the insulation film is removed, and a p-type GaAs contact layer is formed. Thus, a current confinement structure and an index-guided structure are realized.

The reliability of the above semiconductor laser device is improved since the strain in the active layer can be compensated for. However, the above semiconductor laser device also has a drawback that the kink level is low (about 150 mW) due to poor controllability of the ridge width.

(4) Furthermore, IEEE Journal of Quantum Electronics, vol. 29, No. 6, 1993, pp.1889 discloses an internal striped structure semiconductor laser device which oscillates in a fundamental transverse mode, and emits light in the 0.8 $\mu$m band. This semiconductor laser device is formed as follows.

On an n-type GaAs substrate, an n-type AlGaAs lower cladding layer, an AlGaAs/GaAs triple quantum well active layer, a p-type AlGaAs first upper cladding layer, an n-type AlGaAs current confinement layer, and an n-type AlGaAs protection layer are formed in this order. Next, a narrow-stripe groove is formed, by normal photolithography and selective etching, to such a depth that the groove penetrates the n-type AlGaAs current confinement layer. Next, over the above structure, a p-type AlGaAs second upper cladding layer and a p-type GaAs contact layer are formed.

In the above semiconductor laser device, the stripe width can be controlled accurately, and high-output-power oscillation in a fundamental transverse mode can be realized by the difference in the refractive index between the n-type AlGaAs current confinement layer and the p-type AlGaAs second upper cladding layer. However, the above semiconductor laser device also has a drawback that it is difficult to form an AlGaAs layer on another AlGaAs layer since the AlGaAs layers are prone to oxidation.

As described above, the conventional current semiconductor laser devices which include a current confinement structure and an index-guided structure, oscillate in a fundamental transverse mode, and emit light in the 0.9 to 1.1 $\mu$m band with high output power, are unreliable, or uneasy to produce, or have poor characteristics.

(5) Alternatively, in many conventional current semiconductor laser devices which emit light in the 0.9 to 1.1 $\mu$m band, a current confinement structure is provided in crystal layers which constitute the semiconductor laser devices so as to oscillate in a fundamental transverse mode. For example, Proceedings of SPIE, vol. 3628, 1999, pp.38–45 discloses an internal striped structure semiconductor laser device which emits light in the 0.98 μm band. This semiconductor laser device is formed as follows.

On an n-type GaAs substrate, an n-type $Al_xGa_{1-x}As$ lower cladding layer, an n-type GaAs optical waveguide layer, an InGaAs quantum well active layer, a p-type GaAs first upper optical waveguide layer, and an n-type $Al_yGa_{1-y}As$ current confinement layer are formed in this order. Next, a narrow-stripe groove is formed, by normal photolithography and selective etching, to such a depth that the groove penetrates the n-type AlGaAs current confinement layer. Next, over the above structure, a GaAs second optical waveguide layer, a p-type AlGaAs upper cladding layer, and a p-type GaAs contact layer are formed.

In the above semiconductor laser device, the stripe width can be controlled accurately, and high-output-power oscillation in a fundamental transverse mode can be realized by the difference in the refractive index between the n-type AlGaAs current confinement layer and the p-type GaAs second upper cladding layer. However, the above semiconductor laser device also has a drawback that it is difficult to form an AlGaAs layer on another AlGaAs layer since the AlGaAs layers are prone to oxidation. In addition, since the optical waveguide layer is made of GaAs, there is large current leakage, and the threshold current becomes high, although AlGaAs leak-current protection layers are provided on both sides of the active layer.

As in the above example, the conventional current semiconductor laser devices which contain a current confinement structure, and oscillate in a fundamental transverse mode are also unreliable, or uneasy to produce, or have poor characteristics, and the above conventional current semiconductor laser devices cannot oscillate in a fundamental transverse mode when output power is high.

SUMMARY OF THE INVENTION

An object of the present invention is to provide a reliable semiconductor laser device which can oscillate in a fundamental transverse mode even when output power is high.

Another object of the present invention is to provide a process for producing a reliable semiconductor laser device which can oscillate in a fundamental transverse mode even when output power is high.

(1) According to the first aspect of the present invention, there is provided a semiconductor laser device including: a GaAs substrate of a first conductive type; a lower cladding layer of the first conductive type, formed on the GaAs substrate; a lower optical waveguide layer formed on the lower cladding layer; a compressive strain quantum well active layer made of $In_{x3}Ga_{1-x3}As_{1-y3}P_{y3}$, and formed on the lower optical waveguide layer, where $0<x3\leq 0.4$, $0\leq y3\leq 0.1$, and the absolute value of a first product of the strain and the thickness of the compressive strain quantum well active layer is equal to or smaller than 0.25 nm; an upper optical waveguide layer formed on the $In_{x3}Ga_{1-x3}As_{1-y3}P_{y3}$ compressive strain quantum well active layer; a first upper cladding layer made of $In_{0.49}Ga_{0.51}P$ of a second conductive type, and formed on the upper optical waveguide layer; an etching stop layer made of $In_{x1}Ga_{1-x1}As_{1-y1}P_{y1}$, and formed on the first upper cladding layer other than a stripe area of the first upper cladding layer so as to form a first portion of a stripe groove realizing a current injection window, where $0\leq x1\leq 0.3$, $0\leq y1\leq 0.6$, and the absolute value of a second product of the strain and the thickness of the etching stop layer is equal to or smaller than 0.25 nm; a current confinement layer made of $In_{0.49}Ga_{0.51}P$ of the first conductive type, and formed on the etching stop layer so as to form a second portion of the stripe groove; a second upper cladding layer made of $In_{x4}Ga_{1-y4}As_{1-y4}P_{y4}$ of the second conductive type, and formed on the current confinement layer and the stripe area of the first upper cladding layer, where $x4=(0.49\pm 0.01)y4$ and $0.4\leq x4\leq 0.46$; and a contact layer of the second conductive type, formed on the second upper cladding layer. In the semiconductor laser device, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

The first conductive type is different in carrier polarity from the second conductive type. That is, when the first conductive type is n type, and the second conductive type is p type.

The strain of the compressive strain quantum well active layer is defined as $(c_a-c_s)/c_s$, where $c_s$ and $c_a$ are the lattice constants of the GaAs substrate and the compressive strain quantum well active layer, respectively.

The strain of the etching stop layer is defined as $(c_e-c_s)/c_s$, where $c_s$ and $c_e$ are the lattice constants of the GaAs substrate and the etching stop layer, respectively.

When a layer grown over the substrate has a lattice constant c, and an absolute value of the amount $(c-c_s)/c_s$ is equal to or smaller than 0.003, the layer is lattice-matched with the substrate. That is, in the semiconductor laser devices according to the first and second aspects of the present invention, the absolute value of the amount $(c-c_s)/c_s$ is equal to or smaller than 0.003 for each of the lower cladding layer, the lower optical waveguide layer, the upper optical waveguide layer, the first upper cladding layer, the current confinement layer, and the second upper cladding layer.

Preferably, the semiconductor laser device according to the first aspect of the present invention may also have one or any possible combination of the following additional features (i) to (iv).

(i) The semiconductor laser device may further include first and second tensile strain barrier layers both made of $In_{x5}Ga_{1-x5}As_{1-y5}P_{y5}$, and respectively formed above and below the compressive strain quantum well active layer, where $0\leq x5\leq 0.3$ and $0<y5\leq 0.6$, and the absolute value of a sum of the first product and a third product of the strain of the first and second tensile strain barrier layers and a total thickness of the first and second tensile strain barrier layers is equal to or smaller than 0.25 nm. The strain of the first and second tensile strain barrier layers is defined as $(c_b-c_s)/c_s$, where $c_b$ is the lattice constant of the first and second tensile strain barrier layers.

(ii) The etching stop layer may be one of the first and second conductive types.

(iii) The stripe groove may have a width equal to or greater than 1 μm.

(iv) The compressive strain quantum well active layer may include a plurality of quantum wells.

(2) According to the second aspect of the present invention, there is provided a semiconductor laser device including: a GaAs substrate of a first conductive type; a lower cladding layer of the first conductive type, formed on the GaAs substrate; a lower optical waveguide layer formed on the lower cladding layer; a compressive strain quantum well active layer made of $In_{x3}Ga_{1-x3}As_{1-y3}P_{y3}$, and formed on the lower optical waveguide layer, where $0<x3\leq0.4$, $0\leq y3\leq0.1$, and the absolute value of a first product of the strain and the thickness of the compressive strain quantum well active layer is equal to or smaller than 0.25 nm; an upper optical waveguide layer formed on the $In_{x3}Ga_{1-x3}As_{1-y3}P_{y3}$ compressive strain quantum well active layer; a first upper cladding layer made of $In_{0.49}Ga_{0.85}P$ of a second conductive type, and formed on the upper optical waveguide layer; an etching stop layer made of $In_{x1}Ga_{1-x1}As_{1-y1}P_{y1}$ of the second conductive type, and formed on the first upper cladding layer, where $0\leq x1\leq0.3$, $0\leq y1\leq0.6$, and the absolute value of a second product of the strain and the thickness of the etching stop layer is equal to or smaller than 0.25 nm; a current confinement layer made of $In_{0.49}Ga_{0.51}P$ of the first conductive type, and formed on the etching stop layer other than a stripe area of the etching stop layer so as to form a stripe groove realizing a current injection window; a second upper cladding layer made of $In_{x4}Ga_{1-x4}A_{1-y4}P_{y4}$ of the second conductive type, and formed on the current confinement layer and the stripe area of the etching stop layer, where $x4=(0.49\pm0.01)y4$ and $0.4\leq x4\leq0.46$; and a contact layer of the second conductive type, formed on the second upper cladding layer. In the semiconductor laser device, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

Preferably, the semiconductor laser device according to the second aspect of the present invention may also have one or any possible combination of the following additional features (v) to (vii).

(v) The semiconductor laser device may further include first and second tensile strain barrier layers both made of $In_{x5}Ga_{1-x5}As_{1-y5}P_{y5}$ and respectively formed above and below the compressive strain quantum well active layer, where $0\leq x5\leq0.3$ and $0<y5\leq0.6$, and the absolute value of a sum of the first product and a third product of the strain of the first and second tensile strain barrier layers and a total thickness of the first and second tensile strain barrier layers is equal to or smaller than 0.25 nm.

(vi) The stripe groove may have a width equal to or greater than 1 μm.

(vii) The compressive strain quantum well active layer may include a plurality of quantum wells.

(3) According to the third aspect of the present invention, there is provided a process for producing a semiconductor laser device, including the steps of: (a) forming a lower cladding layer of a first conductive type on a GaAs substrate of the first conductive type; (b) forming a lower optical waveguide layer on the lower cladding layer; (c) forming a compressive strain quantum well active layer made of $In_{x3}Ga_{1-x3}As_{1-y3}P_{y3}$, on the lower optical waveguide layer, where $0<x3\leq0.4$, $0\leq y3\leq0.1$, and the absolute value of a first product of the strain and the thickness of the compressive strain quantum well active layer is equal to or smaller than 0.25 nm; (d) forming an upper optical waveguide layer on the $In_{x3}Ga_{1-x3}As_{1-y3}P_{y3}$ compressive strain quantum well active layer; (e) forming a first upper cladding layer made of $In_{0.49}Ga_{0.51}P$ of a second conductive type, on the upper optical waveguide layer; (f) forming an etching stop layer made of $In_{x1}Ga_{1-x1}As_{1-y1}P_{y1}$, on the first upper cladding layer, where $0\leq x1\leq0.3$ and $0\leq y1\leq0.6$, and the absolute value of a second product of the strain and the thickness of the etching stop layer is equal to or smaller than 0.25 nm; (g) forming a current confinement layer made of $In_{0.49}Ga_{0.51}P$ of the first conductive type, on the etching stop layer; (h) removing a stripe area of the current confinement layer so as to form a stripe groove for realizing a current injection window; (i) forming a second upper cladding layer made of $In_{x4}Ga_{1-x4}As_{1-y4}P_{y4}$ of the second conductive type so that the stripe groove is covered with the second upper cladding layer, where $x4=(0.49\pm0.01)y4$ and $0.4\leq x4\leq0.46$; and (j) forming a contact layer of the second conductive type, on the second upper cladding layer. In the process, each of the lower cladding layer, the lower optical waveguide layer, the upper optical waveguide layer, the first upper cladding layer, the current confinement layer, the second upper cladding layer, and the contact layer has such a composition as to lattice-match with the GaAs substrate.

That is, the semiconductor laser device according to the second aspect of the present invention can be produced by the process according to the third aspect of the present invention.

Preferably, the process according to the third aspect of the present invention may also have one or any possible combination of the following additional features (viii) to (xi).

(viii) The process may further include the steps of: (b1) after the step (b), forming a first tensile strain barrier layer made of $In_{x5}Ga_{1-x5}As_{1-y5}P_{y5}$, on the lower optical waveguide layer, where $0\leq x5\leq0.3$ and $0<y5\leq0.6$; and (c1) after the step (c), forming a second tensile strain barrier layer made of $In_{x5}Ga_{1-x5}As_{1-y5}P_{y5}$, on the compressive strain quantum well active layer; where the absolute value of a sum of the first product and a third product of the strain of the first and second tensile strain barrier layers and a total thickness of the first and second tensile strain barrier layers is equal to or smaller than 0.25 nm.

(ix) The process may further include, after the step (g), the steps of: (g1) forming a cap layer made of GaAs; and (g2) removing a stripe area of the cap layer; and the process may further include, after the step (h), the step of (h1) removing a remaining area of the cap layer and a stripe area of the etching stop layer so as to form an additional portion of the stripe groove. That is, the semiconductor laser device according to the first aspect of the present invention can be produced by the process according to the third aspect of the present invention when the process includes the above steps (g1), (g2), and (h1). When a GaAs cap layer is used as in the above steps (g1), (g2), and (h1), it is possible to prevent formation of a natural oxidation film on the InGaP current confinement layer, and metamorphic change in the InGaP current confinement layer, which may occur when a resist layer is formed directly on the InGaP current confinement layer. In addition, since the GaAs cap layer is removed before the second upper cladding layer is formed, it is possible to remove a residue left on a boundary surface on which the second upper cladding layer is formed, and prevent the occurrence of crystal defects.

(x) The cap layer may be one of the first and second conductive types.

(xi) The etching stop layer may be one of the first and second conductive types.

(4) The first and second aspects of the present invention have the following advantages.

(a) In the semiconductor laser devices according to the first and second aspects of the present invention, the current confinement layer is made of $In_{0.49}Ga_{0.51}P$, and the second upper cladding layer is made of $In_{x4}Ga_{1-x4}As_{1-y4}P_{y4}$. Therefore, the difference in the refractive indexes between the current confinement layer and the second upper cladding layer realizes a difference of about $1.5 \times 10^{-3}$ to $7 \times 10^{-3}$ in the equivalent refractive index of the active layer between the portion under the current confinement layer and the portion a under the stripe groove, with high accuracy, and it is possible to cut off oscillation in higher modes. Thus, oscillation in the fundamental transverse mode can be maintained even when the output power becomes high.

(b) When aluminum exists near a boundary surface on which the second upper cladding layer is formed, the boundary surface is prone to oxidation, and it is difficult to realize desired characteristics in the semiconductor laser device. However, the $In_{0.49}Ga_{0.51}P$ first upper cladding layer, the $In_{x1}Ga_{1-x1}As_{1-y1}P_{y1}$ etching stop layer, or the $In_{0.49}Ga_{0.51}P$ current confinement layer, which can be exposed at a boundary surface on which the second upper cladding layer is formed, do not include aluminum. Therefore, it is easy to form the second upper cladding layer. In addition, since no crystal defect due to oxidation of aluminum occurs, the characteristics of the semiconductor laser device do not deteriorate, and reliability is improved.

(c) Since the current confinement layer is arranged within the semiconductor laser device, it is possible to increase the contact area between the electrode and the contact layer. Therefore, the contact resistance can be reduced.

(d) Since the etching stop layer is made of InGaAsP, controllability of the stripe width by wet etching is enhanced.

(e) Although the InGaAsP etching stop layer does not have a stripe opening for the current injection window in the semiconductor laser device according to the second aspect of the present invention, the semiconductor laser device according to the second aspect of the present invention has the same advantages as the semiconductor laser device according to the first aspect of the present invention.

(f) When the tensile strain barrier layers are provided as described in the paragraphs (1)(i) and (2)(v), various characteristics are improved (e.g., the threshold current is lowered), and reliability is increased.

(g) When the stripe width is equal to or greater than 1 µm, as described in paragraphs (1)(iii) and (2)(vi), the semiconductor laser device can oscillate in multiple modes with high output power and low noise.

(5) According to the fourth aspect of the present invention, there is provided a semiconductor laser device including: a GaAs substrate of a first conductive type; a lower cladding layer of the first conductive type, formed on the GaAs substrate; a lower optical waveguide layer, and formed on the lower cladding layer; a compressive strain quantum well active layer made of $In_{x3}Ga_{1-x3}As_{1-y3}P_{y3}$, and formed on the lower optical waveguide layer, where $0 < x3 \leq 0.4$ and $0 \leq y3 \leq 0.1$; a first upper optical waveguide layer made of $In_{x2}Ga_{1-x2}As_{1-y2}P_{y3}$, and formed on the $In_{x3}Ga_{1-x3}As_{1-y3}P_{y3}$ compressive strain quantum well active layer, where $x2=(0.49\pm0.01)y2$ and $0 \leq x2 \leq 0.3$; a first etching stop layer made of $In_{x6}Ga_{1-x6}P$ of a second conductive type, and formed on the first upper optical waveguide layer, where $0.2 \leq x6 \leq 0.8$; a second etching stop layer made of $In_{x4}Ga_{1-x1}As_{1-y1}P_{y1}$, and formed on the first etching stop layer other than a stripe area of the first etching stop layer so as to form a first portion of a stripe groove realizing a current injection window, where $0 \leq x1 \leq 0.3$ and $0 \leq y1 \leq 0.6$; a current confinement layer made of $In_{0.49}Ga_{0.51}P$ of the first conductive type, and formed on the second etching stop layer so as to form a second portion of the stripe groove; a second upper optical waveguide layer made of $In_{x2}Ga_{1-x2}As_{1-y2}P_{y2}$ of the second conductive type so as to cover the stripe groove, where $x2=(0.49\pm0.01)y2$ and $0 \leq x2 \leq 0.3$; an upper cladding layer made of $In_{x4}Ga_{1-x4}As_{1-y4}P_{y4}$ of the second conductive type, and formed over the second upper optical waveguide layer, where $x4=(0.49\pm0.01)y4$ and $0.9 \leq y4 \leq 1$; and a contact layer of the second conductive type, formed on the upper cladding layer. In the semiconductor laser device, the absolute value of a first product of the strain and the thickness of the compressive strain quantum well active layer is equal to or smaller than 0.25 nm, the absolute value of a sum of a second product and a third product is equal to or smaller than 0.25 nm, where the second product is a product of the strain and the thickness of the first etching stop layer, and the third product is a product of the strain and the thickness of the second etching stop layer, and each of the lower cladding layer, the lower optical waveguide layer, the first and second upper optical waveguide layers, the current confinement layer, the upper cladding layer, and the contact layer is formed to have such composition as to lattice-match with the GaAs substrate.

Preferably, the semiconductor laser device according to the fourth aspect of the present invention may also have one or any possible combination of the following additional features (xii) to (xv).

(xii) The semiconductor laser device may further include first and second tensile strain barrier layers both made of $In_{x5}Ga_{1-x5}As_{1-y5}P_{y5}$, and respectively formed above and below the compressive strain quantum well active layer, where $0 \leq x5 \leq 0.3$ and $0 < y5 \leq 0.6$, and the absolute value of a sum of the first product and a fourth product of the strain of the first and second tensile strain barrier layers and a total thickness of the first and second tensile strain barrier layers is equal to or smaller than 0.25 nm.

(xiii) The second etching stop layer may be one of the first and second conductive types.

(xiv) The stripe groove may have a width equal to or greater than 1 µm.

(xv) The compressive strain quantum well active layer may include a plurality of quantum wells.

(6) According to the fifth aspect of the present invention, there is provided a process for producing a semiconductor laser device, including the steps of: (a) forming a lower cladding layer of a first conductive type on a GaAs substrate of the first conductive type; (b) forming a lower optical waveguide layer on the lower cladding layer; (c) forming a compressive strain quantum well active layer made of $In_{x3}Ga_{1-x3}As_{1-y3}P_{y3}$, on the lower optical waveguide layer, where $0 < x3 \leq 0.4$, $0 \leq y3 \leq 0.1$, and the absolute value of a first product of the strain and the thickness of the compressive strain quantum well active layer is equal to or smaller than 0.25 nm; (d) forming a first upper optical waveguide layer made of $In_{x2}Ga_{1-x2}As_{1-y2}P_{y2}$, on the $In_{x3}Ga_{1-x3}AS_{1-y3}P_{y3}$ compressive strain quantum well active layer, where $x2=(0.49\pm0.01)y2$ and $0 \leq x2 \leq 0.3$; (e) forming a first etching stop layer made of $In_{x6}Ga_{1-x6}P$ of a second conductive type, on the first upper optical waveguide layer, where $0.2 \leq x6 \leq 0.8$; (f) forming a second etching stop layer made of $In_{x1}Ga_{1-x1}As_{1-y1}P_{y1}$, on the first upper cladding layer, where $0 \leq x1 \leq 0.3$ and $0 \leq y1 \leq 0.6$; (g) forming a current confinement layer made of $In_{0.49}Ga_{0.51}P$ of the first conductive type, on the second etching stop layer; (h) removing a stripe area of the current confinement layer and a stripe area of the second etching stop layer so as to form a stripe groove realizing a current injection window; (i) forming a second upper optical waveguide layer made of $In_{x2}Ga_{1-x2}As_{1-y2}P_{y2}$ of the second conductive type, so as to cover the stripe groove, where $x2=(0.49\pm0.01)y2$ and $0\leq x2\leq 0.3$; (j) forming an upper cladding layer made of $In_{x4}Ga_{1-x4}As_{1-y4}P_{y4}$ of the second conductive type, over the second upper optical waveguide layer, where $x4=(0.49\pm0.01)y4$ and $0.9\leq y4\leq 1$; (k) forming a contact layer of the second conductive type, on the second upper cladding layer. In the process, the absolute value of a sum of a second product and a third product is equal to or smaller than 0.25 nm, where the second product is a product of the strain and the thickness of the first etching stop layer, and the third product is a product of the strain and the thickness of the second etching stop layer, and each of the lower cladding layer, the lower optical waveguide layer, the first and second upper optical waveguide layers, the current confinement layer, the upper cladding layer, and the contact layer is formed to have such a composition as to lattice-match with the GaAs substrate.

That is, the semiconductor laser device according to the fourth aspect of the present invention can be produced by the process according to the fifth aspect of the present invention.

Preferably, the process according to the fifth aspect of the present invention may also have one or any possible combination of the following additional features (xvi) to (xix).

(xvi) The process may further include the steps of: (b1) after the step (b), forming a first tensile strain barrier layer made of $In_{x5}Ga_{1-x5}As_{1-y5}P_{y5}$, on the lower optical waveguide layer, where $0\leq x5\leq 0.3$ and $0<y5\leq 0.6$; and (c1) after the step (c), forming a second tensile strain barrier layer made of $In_{x5}Ga_{1-x5}As_{1-x5}P_{y5}$, on the compressive strain quantum well active layer, where the absolute value of a sum of the first product and a fourth product of the strain of the first and second tensile strain barrier layers and a total thickness of the first and second tensile strain barrier layers is equal to or smaller than 0.25 nm.

(xvii) The process may further include, after the step (g), the step of (g1) forming a cap layer made of GaAs, and the step (h) comprising the substeps of: (h1) removing a stripe area of the cap layer and the stripe area of the current confinement layer, and (h2) removing a remaining area of the cap layer and the stripe area of the second etching stop layer. When a GaAs cap layer is used as in the above steps (g1) and (h1), it is possible to prevent formation of a natural oxidation film on the InGaP current confinement layer, and metamorphic change in the InGaP current confinement layer, which occurs when a resist layer is formed directly on the InGaP current confinement layer. In addition, since the GaAs cap layer is removed before the second upper optical waveguide layer is formed, it is possible to remove a residue left on the boundary surface on which the second upper optical waveguide layer is formed, and prevent the occurrence of crystal defects.

(xviii) The second etching stop layer may be one of the first and second conductive types.

(xix) The cap layer may be one of the first and second conductive types.

(7) The fifth aspect of the present invention has the following advantages.

(a) In the semiconductor laser device according to the third aspect of the present invention, the current confinement layer is made of $In_{0.49}Ga_{0.51}P$, and the second upper optical waveguide layer is made of $In_{x4}Ga_{1-x4}As_{1-y4}P_{y4}$. Therefore, the difference in the refractive index between the current confinement layer and the second upper optical waveguide layer realizes a difference of $1.5\times10^{-3}$ to $7\times10^{-3}$ in the equivalent refractive index of the active layer between the portion under the current confinement layer and the portion under the stripe groove, with high accuracy, and it is possible to cut off oscillation in higher modes. Thus, oscillation in the fundamental transverse mode can be maintained even when the output power becomes high.

(b) Deterioration of light exit end surfaces of semiconductor laser devices which emit laser light with high output power can be effectively prevented by increasing the thickness of the optical waveguide layer, since the peak optical density is reduced when the thickness of the optical waveguide layer is increased. However, in the conventional semiconductor laser devices having a current confinement structure and an index-guided structure, it is impossible to increase the thickness of a portion between the current confinement layer and the active layer since a fundamental transverse mode must be achieved. In particular, the thickness of the optical waveguide layer is limited since the optical waveguide layer is located between the current confinement layer and the active layer on the other hand, in the semiconductor laser device according to the fifth aspect of the present invention, the thickness of the optical waveguide layer is substantially increased by arranging the $In_{x1}Ga_{1-x1}As_{1-y1}P_{y1}$ second upper optical waveguide layer above the current confinement layer, where the second upper optical waveguide layer has the same composition as the first upper optical waveguide layer. Therefore, it is possible to reduce the peak optical density and the deterioration of a light exit end surface which is caused by high optical density. Thus, reliability is increased.

(c) Compared with the conventional semiconductor laser device, the difference in the band gap between the active layer and the $In_{x1}Ga_{1-x1}As_{1-y1}P_{y1}$ second upper optical waveguide layer can be increased by provision of the $In_{x1}Ga_{1-x1}As_{1-y1}P_{y1}$ second upper optical waveguide layer. Therefore, it is possible to prevent leakage currents, and efficiently confine the carriers. Thus, the threshold current can be lowered.

(d) Since the current confinement layer is arranged within the semiconductor laser device, it is possible to increase the contact area between the electrode and the contact layer. Therefore, the contact resistance can be reduced.

(e) The first etching stop layer is made of $In_{x6}Ga_{1-x6}P_{y1}$, and the second etching stop layer made of $In_{x1}Ga_{1-x1}As_{1-y1}P_{y1}$ is formed on the first etching stop layer. Therefore, when a sulfuric acid etchant is used, only the $In_{x1}Ga_{1-x6}As_{1-y1}P_{y1}$ second etching stop layer is etched, and the $In_{x6}Ga_{1-x6}P$ first etching stop layer is not etched. That is, it is possible to stop etching accurately on the surface of the first etching stop layer, and thus the stripe width can be accurately controlled by wet etching.

(f) Since the $In_{0.49}Ga_{0.51}P$ first upper cladding layer, the $In_{x1}Ga_{1-x1}As_{1-y1}P_{y1}$ etching stop layer, or the $In_{0.49}Ga_{0.51}P$ current confinement layer, which can be exposed at a boundary surface on which the second upper optical waveguide layer is formed, does not include aluminum, it is easy to form the second upper optical waveguide layer. In addition, since no crystal defect due to oxidation of aluminum occurs, the characteristics of the semiconductor laser device do not deteriorate, and reliability is improved.

(g) when the tensile strain barrier layers are provided as described in paragraphs (5) (xii), various characteristics are improved (e.g., the threshold current is lowered), and reliability is increased.

(h) When the stripe width is equal to or greater than 1 μm, as described in paragraphs (5) (xiv), the semiconductor laser device can oscillate in multiple modes with high output power and low noise.

DESCRIPTION OF THE DRAWINGS

FIGS. 4A to 4C are cross-sectional views of representative stages in the process for producing a semiconductor laser device as the fourth embodiment.

DESCRIPTION OF PREFERRED EMBODIMENTS

Embodiments of the present invention are explained in detail below with reference to drawings.

First Embodiment

FIGS. 1A to 1D show cross sections of the representative stages in the process for producing a semiconductor laser device as the first embodiment, where the cross sections are perpendicular to the direction of light emitted from the semiconductor laser device.

Figure 1A:
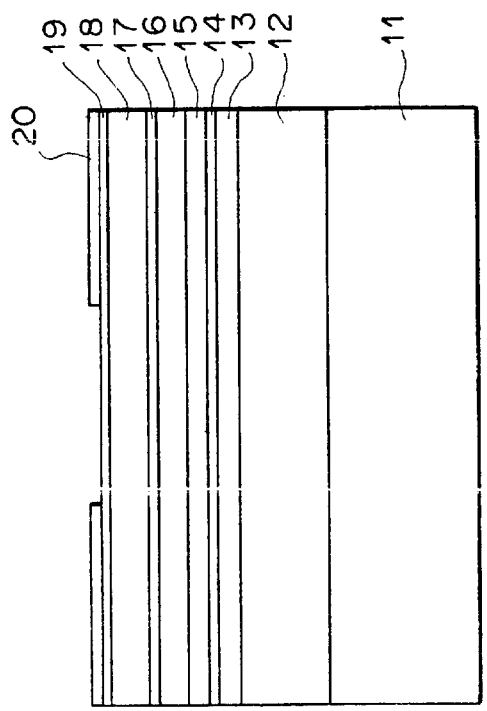
FIGS. 1A to 1D are cross-sectional views of representative stages in the process for producing a semiconductor laser device as the first embodiment.

First, as illustrated in FIG. 1A, an n-type $In_{0.49}Ga_{0.51}P$ lower cladding layer 12, an n-type or i-type (intrinsic) $In_{x2}Ga_{1-x2}As_{1-y2}P_{y2}$ optical waveguide layer 13 ($x2=(0.49\pm0.01)y2$, $0\leq x2\leq 0.3$), an $In_{x3}Ga_{1-x3}As_{1-y3}P_{y3}$ compressive strain quantum well active layer 14 ($0<x3\leq 0.4$, $0\leq y3\leq 0.1$), a p-type or i-type (intrinsic) $In_{x2}Ga_{1-x2}As_{1-y2}P_{y2}$ optical waveguide layer 15 ($x2=(0.49\pm0.01)y2$, $0\leq x2\leq 0.3$), a p-type $In_{0.49}Ga_{0.51}P$ first upper cladding layer 16, an n-type or p-type $In_{x1}Ga_{1-x1}As_{1-y1}P_{y1}$ etching stop layer 17 ($0\leq x1\leq 0.3$, $0\leq y1\leq 0.6$) having a thickness of, for example, 20 nm, an n-type $In_{0.49}Ga_{0.51}P$ current confinement layer 18 having a thickness of, for example, 1 μm, and an n-type GaAs cap layer 19 having a thickness of, for example, 10 nm are formed on an n-type GaAs substrate 11 by organometallic vapor phase epitaxy. Then, a $SiO_2$ film 20 is formed over the n-type GaAs cap layer 19, and a stripe area having a width of about 3 μm and extending in the <011> direction of the $SiO_2$ film 20 is removed by normal photolithography.

Figure 1B:
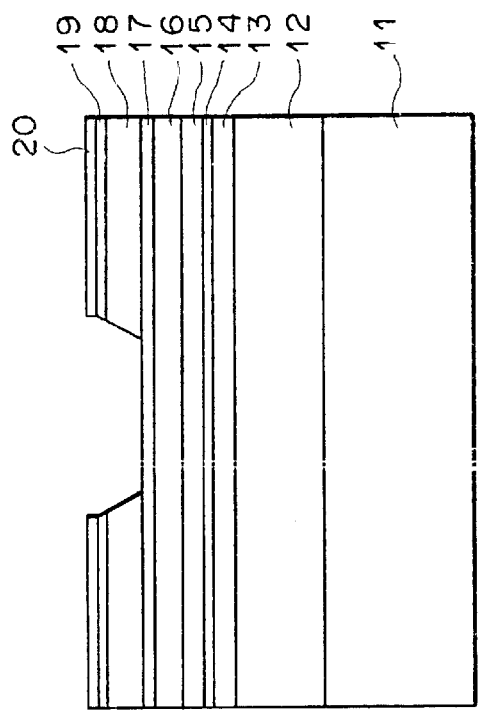

Next, as illustrated in FIG. 1B, the n-type GaAs cap layer 19 is etched with a sulfuric acid etchant by using the $SiO_2$ film 20 as a mask. Then, the exposed area of the n-type $In_{0.49}Ga_{0.51}P$ current confinement layer 18 is etched with a hydrochloric acid etchant until the n-type or p-type $In_{x1}Ga_{1-x1}As_{1-y1}P_{y1}$ etching stop layer 17 is exposed.

Figure 1C:
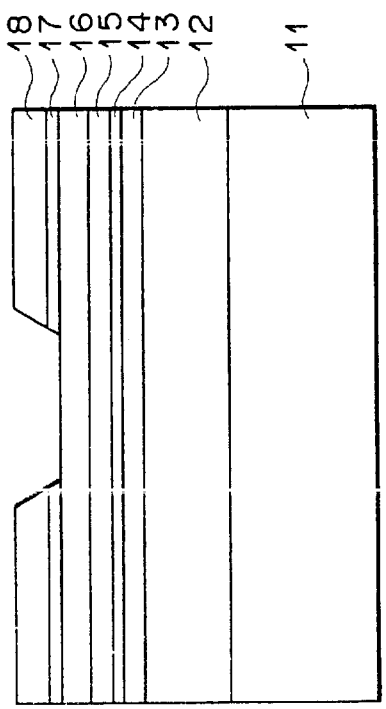

Thereafter, as illustrated in FIG. 1C, the remaining areas of the $SiO_2$ film 20 are removed by etching using a fluoric acid etchant. Then, the n-type GaAs cap layer 19 and the exposed area of the n-type or p-type $In_{x1}Ga_{1-x1}As_{1-y1}P_{y1}$, etching stop layer 17 are removed by etching using a sulfuric acid etchant.

Figure 1D:
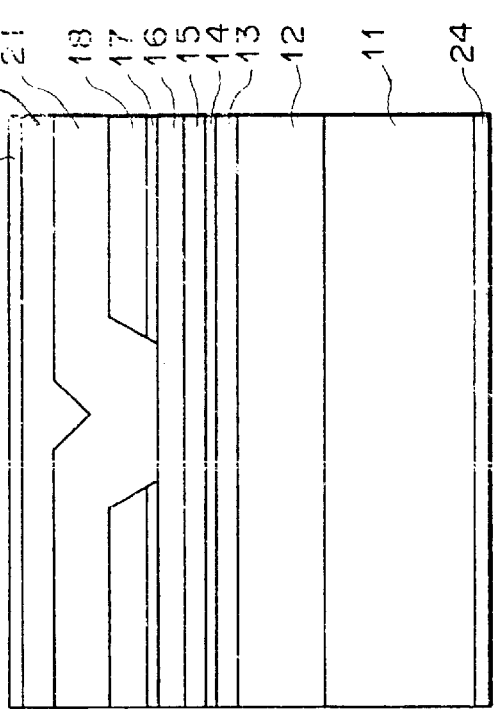

Finally, as illustrated in FIG. 1D, a p-type $In_{x4}Ga_{1-x4}As_{1-y4}P_{y4}$ second upper cladding layer 21 ($x4=(0.49\pm0.01)y4$, $0.4\leq x4\leq 0.46$) and a p-type GaAs contact layer 22 are formed over the construction of FIG. 1C. Then, a p electrode 23 is formed on the p-type GaAs contact layer 22. In addition, the exposed surface of the substrate 11 is polished, and an n electrode 24 is formed on the polished surface of the substrate 11. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type $In_{0.49}Ga_{0.51}P$ first upper cladding layer 16 has such a thickness that oscillation in a fundamental transverse mode can be maintained even when output power becomes high. In addition, since a current confinement structure and a real refractive index structure are realized by the provision of the p-type $In_{x4}Ga_{1-x4}As_{1-y4}P_{y4}$ second upper cladding layer 21 and the n-type $In_{0.49}Ga_{0.51}P$ current confinement layer 18, it is possible to realize a difference of about $1.5\times 10^{-3}$ to $7\times 10^{-3}$ in the equivalent refractive index of the active layer between the portion under the current confinement layer and the portion under the stripe area. Therefore, oscillation in a fundamental transverse mode can be maintained even when the output power becomes high.

Second Embodiment

FIGS. 2A to 2D show cross sections of the representative stages in the process for producing a semiconductor laser device as the second embodiment, where the cross sections are perpendicular to the direction of light emitted from the semiconductor laser device.

Figure 2A:
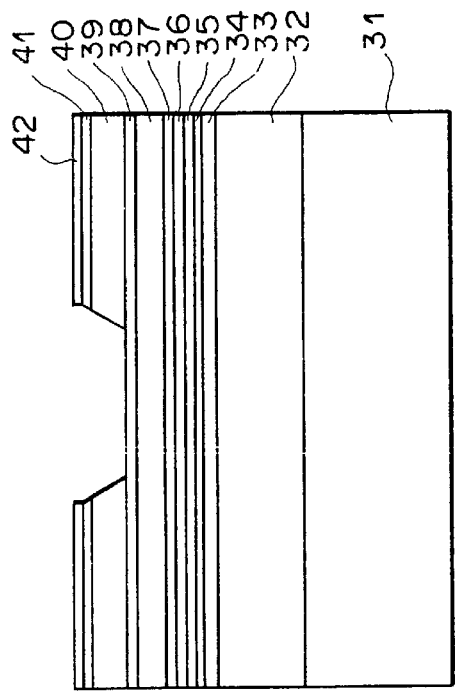
FIGS. 2A to 2D are cross-sectional views of representative stages in the process for producing a semiconductor laser device as the second embodiment.

First, as illustrated in FIG. 2A, an n-type $In_{0.49}Ga_{0.51}P$ lower cladding layer 32, an n-type or i-type $In_{x2}Ga_{1-x2}As_{1-y2}P_{y2}$ optical waveguide layer 33 ($x2=(0.49\pm0.01)y2$, $0\leq x2\leq 0.3$), an $In_{x5}Ga_{1-x5}As_{1-y5}P_{y5}$ tensile strain barrier layer 34 ($0\leq x5\leq 0.3$, $0<y5\leq 0.6$), an $In_{x3}Ga_{1-x3}As_{1-y3}P_{y3}$ compressive strain quantum well active layer 35 ($0<x3\leq 0.4$, $0\leq y3\leq 0.1$), an $In_{x5}Ga_{1-x5}As_{1-y5}P_{y5}$ tensile strain barrier layer 36 ($0\leq x5\leq 0.3$, $0<y5\leq 0.6$), a p-type or i-type $In_{x2}Ga_{1-x2}As_{1-y2}P_{y2}$ optical waveguide layer 37 ($x2=(0.49\pm0.01)y2$, $0\leq x2\leq 0.3$), a p-type $In_{0.49}Ga_{0.51}P$ first upper cladding layer 38, an n-type or p-type $In_{x1}Ga_{1-x1}As_{1-y1}P_{y1}$ etching stop layer 39 ($0\leq x1\leq 0.3$, $0\leq y1\leq 0.6$) having a thickness of, for example, 20 nm, an n-type $In_{0.49}Ga_{0.51}P$ current confinement layer 40 having a thickness of, for example, 1 μm, and an n-type GaAs cap layer 41 are formed on an n-type GaAs substrate 31 by organometallic vapor phase epitaxy. Then, a SiO$_2$ film 42 is formed over the n-type GaAs cap layer 41, and a stripe area having a width of about 3 μm and extending in the <011> direction of the SiO$_2$ film 42 is removed by normal photolithography.

Figure 2B:
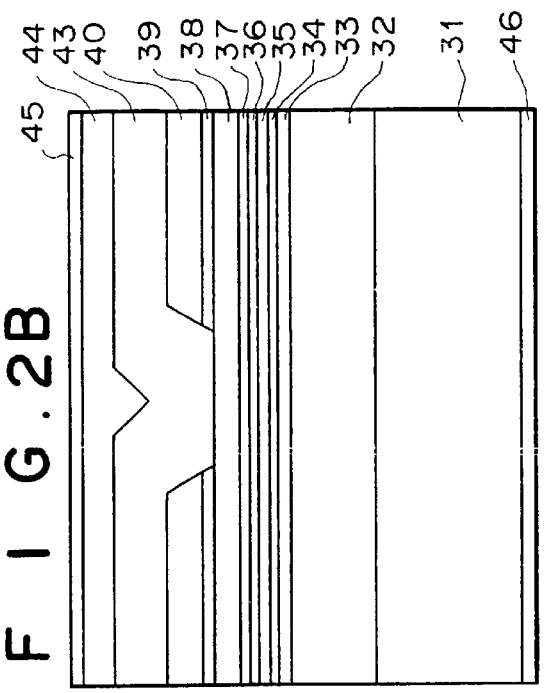

Next, as illustrated in FIG. 2B, the n-type GaAs cap layer 41 is etched with a sulfuric acid etchant by using the SiO$_2$ film 42 as a mask. Then, the exposed area of the n-type In$_{0.49}$Ga$_{0.51}$P current confinement layer 40 is etched with a hydrochloric acid etchant until the n-type or p-type In$_{x1}$Ga$_{1-x1}$As$_{1-y1}$P$_{y1}$ etching stop layer 39 is exposed.

Figure 2C:
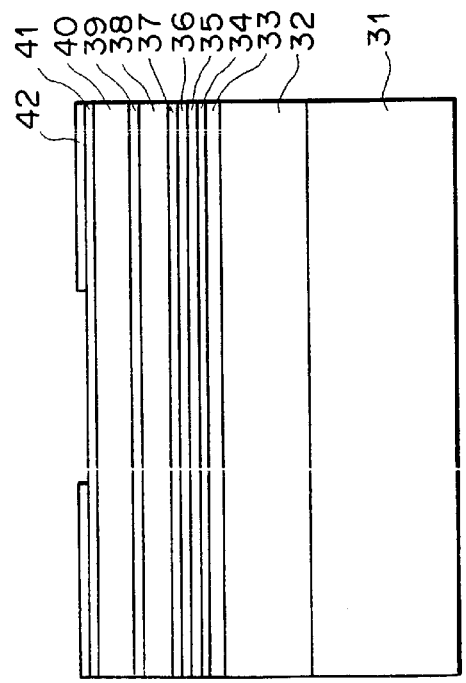

Thereafter, as illustrated in FIG. 2C the remaining areas of the SiO$_2$ film 42 are removed by etching using a fluoric acid etchant. Then, the n-type GaAs cap layer 41 and the exposed area of the n-type or p-type In$_{x1}$Ga$_{1-x1}$As$_{1-y1}$P$_{y1}$ etching stop layer 39 are removed by etching using a sulfuric acid etchant.

Figure 2D:
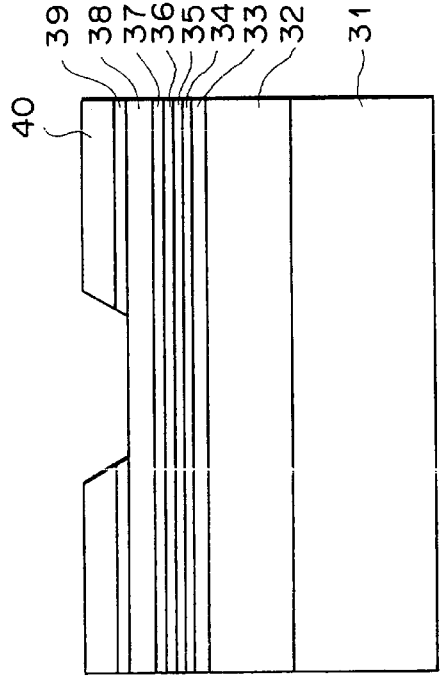

Finally, as illustrated in FIG. 2D, a p-type In$_{x4}$Ga$_{1-x4}$As$_{1-y4}$P$_{y4}$ second upper cladding layer 43 (x4=(0.49±0.01) y4, 0.4≦x4≦0.46) and a p-type GaAs contact layer 44 are formed over the construction of FIG. 2C. Then, a p electrode 45 is formed on the p-type GaAs contact layer 44. In addition, the exposed surface of the substrate 31 is polished, and an n electrode 46 is formed on the polished surface of the substrate 31. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type In$_{0.49}$Ga$_{0.51}$P first upper cladding layer 38 has such a thickness that oscillation in a fundamental transverse mode can be maintained even when output power becomes high.

In the construction of the second embodiment, the In$_{x3}$Ga$_{1-x3}$As$_{1-y3}$P$_{y3}$ compressive strain quantum well active layer 35 is sandwiched between the In$_{x5}$Ga$_{1-x5}$As$_{1-y5}$P$_{y5}$ tensile strain barrier layers 34 and 36. Therefore, compared with the first embodiment, characteristics are improved (e.g., the threshold current is lowered), and reliability is increased.

Third Embodiment

FIGS. 3A to 3D show cross sections of the representative stages in the process for producing a semiconductor laser device as the third embodiment, where the cross sections are perpendicular to the direction of light emitted from the semiconductor laser device.

Figure 3A:
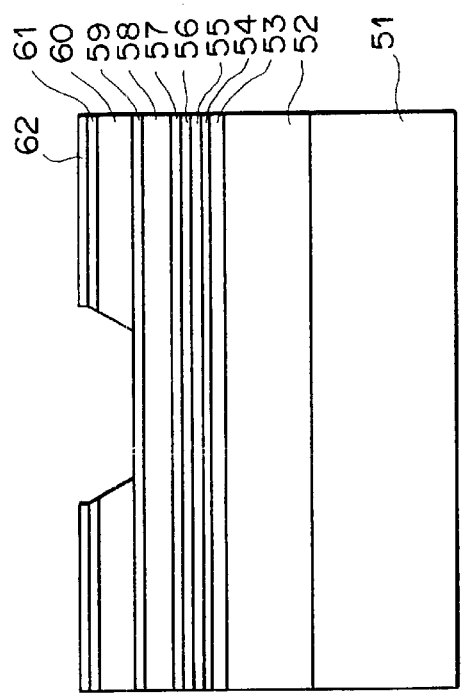
FIGS. 3A to 3D are cross-sectional views of representative stages in the process for producing a semiconductor laser device as the third embodiment.

First, as illustrated in FIG. 3A, an n-type Al$_{z1}$Ga$_{1-z1}$As lower cladding layer 52 (0.35≦z1≦0.7), an n-type or i-type Al$_{z2}$Ga$_{1-z2}$As optical waveguide layer 53 (0≦z2≦0.2), an In$_{x5}$Ga$_{1-x5}$As$_{1-y5}$P$_{y5}$ tensile strain barrier layer 54 (0≦x5≦0.3, 0<y5≦0.6), an In$_{x3}$Ga$_{1-x3}$As$_{1-y3}$P$_{y3}$ compressive strain quantum well active layer 55 (0<x3≦0.4, 0≦y3≦0.1), an In$_{x5}$Ga$_{1-x5}$As$_{1-y5}$P$_{y5}$ tensile strain barrier layer 56 (0<x5≦0.3, 0<y5≦0.6), a p-type or i-type Al$_{z2}$Ga$_{1-z2}$As optical waveguide layer 57 (0≦z2≦0.2), a p-type In$_{0.49}$Ga$_{0.51}$P first upper cladding layer 58, an n-type or p-type In$_{x1}$Ga$_{1-x1}$As$_{1-y1}$P$_{y1}$ etching stop layer 59 (0≦x1≦0.3, 0≦y1≦0.6) having a thickness of, for example, 20 nm, an n-type In$_{0.49}$Ga$_{0.51}$P current confinement layer 60 having a thickness of, for example, 1 μm, and an n-type GaAs cap layer 61 having a thickness of, for example, 10 nm are formed on an n-type GaAs substrate 51 by organometallic vapor phase epitaxy. Then, a SiO$_2$ film 62 is formed over the n-type GaAs cap layer 61, and a stripe area having a width of about 3 μm and extending in the <011> direction of the SiO$_2$ film 62 is removed by normal photolithography.

Figure 3B:
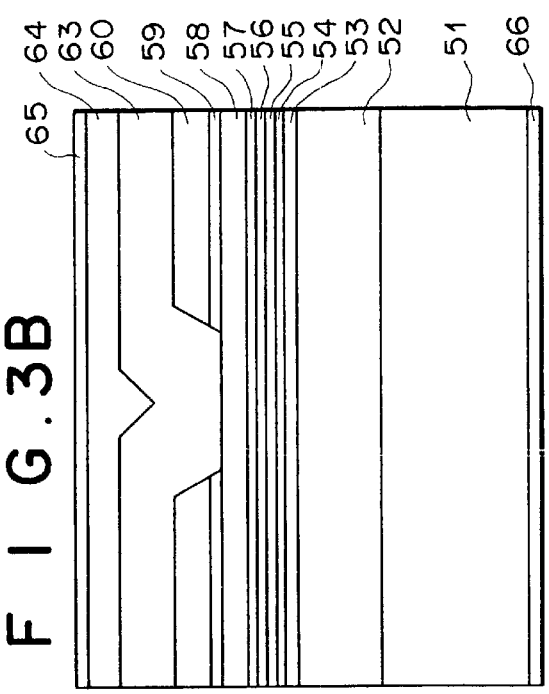

Next, as illustrated in FIG. 3B, the n-type GaAs cap layer 61 is etched with a sulfuric acid etchant by using the SiO$_2$, film 62 as a mask. Then, the exposed area of the n-type In$_{0.49}$Ga$_{0.51}$P current confinement layer 60 is etched with a hydrochloric acid etchant until the n-type or p-type In$_{x1}$Ga$_{1-x1}$As$_{1-y1}$P$_{y1}$ etching stop layer 59 is exposed.

Figure 3C:
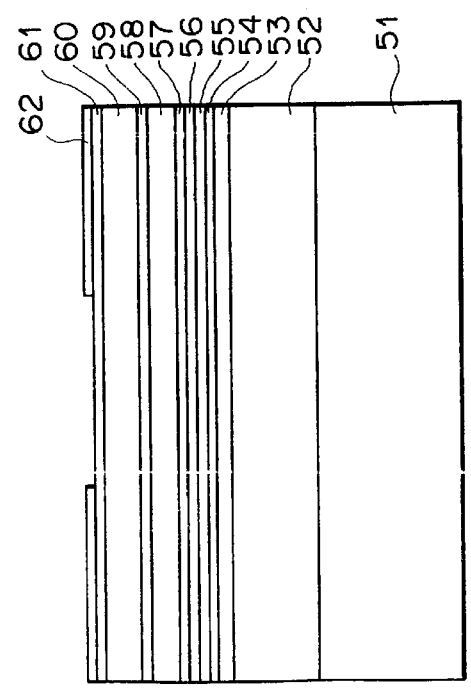

Thereafter, as illustrated in FIG. 3C, the remaining areas of the SiO$_2$ film 62 are removed by etching using a fluoric acid etchant. Then, the n-type GaAs cap layer 61 and the exposed area of the n-type or p-type In$_{x1}$Ga$_{1-x1}$As$_{1-y1}$P$_{y1}$ etching stop layer 59 are removed by etching using a sulfuric acid etchant.

Figure 3D:
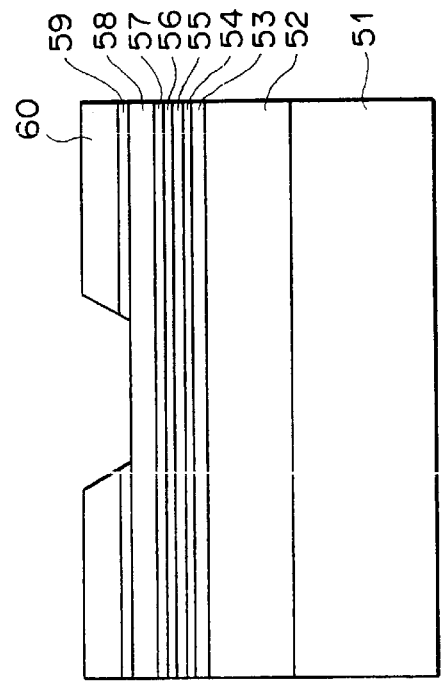

Finally, as illustrated in FIG. 3D, a p-type In$_{x4}$Ga$_{1-x4}$As$_{1-y4}$P$_{y4}$ second upper cladding layer 63 (x4=(0.49±0.01) y4, 0.4≦x4≦0.46) and a p-type GaAs contact layer 64 are formed over the construction of FIG. 3C. Then, a p electrode 65 is formed on the p-type GaAs contact layer 64. In addition, the exposed surface of the substrate 51 is polished, and an n electrode 66 is formed on the polished surface of the substrate 51. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type In$_{0.49}$Ga$_{0.51}$P first upper cladding layer 58 has such a thickness that oscillation in a fundamental transverse mode can be maintained even when output power becomes high.

In the construction of the third embodiment, the In$_{x3}$Ga$_{1-x3}$As$_{1-y3}$P$_{y3}$ compressive strain quantum well active layer 55 is also sandwiched between the In$_{x5}$Ga$_{1-x5}$As$_{1-y5}$P$_{y5}$ tensile strain barrier layers 54 and 56. Therefore, compared with the first embodiment, characteristics are improved (e.g., the threshold current is lowered), and reliability is increased.

Fourth Embodiment

FIGS. 4A to 4C show cross sections of the representative stages in the process for producing a semiconductor laser device as the fourth embodiment, where the cross sections are perpendicular to the direction of light emitted from the semiconductor laser device.

First, as illustrated in FIG. 4A, an n-type In$_{0.49}$Ga$_{0.51}$P lower cladding layer 72, an n-type or i-type In$_{x2}$Ga$_{1-x2}$As$_{1-y2}$P$_{y2}$ optical waveguide layer 73 (x2=(0.49±0.01)y2, 0≦x2≦0.3), an In$_{x5}$Ga$_{1-x5}$As$_{1-y5}$P$_{y5}$ tensile strain barrier layer 74 (0≦x5≦0.3, 0<y5≦0.6), an In$_{x3}$Ga$_{1-x3}$As$_{1-y3}$P$_{y3}$ compressive strain quantum well active layer 75 (0<x3≦0.4, 0≦y3≦0.1), an In$_{x5}$Ga$_{1-x5}$As$_{1-y5}$P$_{y5}$ tensile strain barrier layer 76 (0≦x5≦0.3, 0<y5≦0.6), a p-type or i-type In$_{x2}$Ga$_{1-x2}$As$_{1-y2}$P$_{y2}$ optical waveguide layer 77 (x2=(0.49±0.01) y2, 0≦x2≦0.3), a p-type In$_{0.49}$Ga$_{0.51}$P first upper cladding layer 78, a p-type In$_{x1}$Ga$_{1-x1}$As$_{1-y1}$P$_{y1}$ etching stop layer 79 (0≦x1≦0.3, 0≦y1≦0.6) having a thickness of, for example, 20 nm, and an n-type In$_{0.49}$Ga$_{0.51}$ P current confinement layer 80 having a thickness of, for example, 1 μm are formed on an n-type GaAs substrate 71 by organometallic vapor phase epitaxy. Then, a SiO$_2$ film 82 is formed over the n-type In$_{0.49}$Ga$_{0.51}$P current confinement layer 80, and a stripe area having a width of about 3 μm and extending in the <011> direction of the SiO$_2$ film 82 is removed by normal photolithography.

Next, as illustrated in FIG. 4B, the n-type In$_{0.49}$Ga$_{0.51}$P current confinement layer 80 is etched with a hydrochloric acid etchant by using the SiO$_2$ film 82 as a mask until the p-type In$_{x1}$Ga$_{1-x1}$As$_{1-y1}$P$_{y1}$ etching stop layer 79 is exposed. Then, the remaining areas of the SiO$_2$ film 82 are removed by etching using a fluoric acid etchant.

Thereafter, as illustrated in FIG. 4C, a p-type In$_{x4}$Ga$_{1-x4}$As$_{1-y4}$P$_{y4}$ second upper cladding layer 83 (x4=(0.49±0.01)y4, 0.4≦x4≦0.46) and a p-type GaAs contact layer 84 are formed over the construction of FIG. 4B. Then, a p electrode 85 is formed on the p-type GaAs contact layer 84. In addition, the exposed surface of the substrate 71 is polished, and an n electrode 86 is formed on the polished surface of the substrate 71. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type In$_{0.49}$Ga$_{0.51}$P first upper cladding layer 78 has such a thickness that oscillation in a fundamental transverse mode can be maintained even when output power becomes high.

As described above, in the fourth embodiment, a stripe area of the p-type In$_{x1}$Ga$_{1-x1}$As$_{1-y1}$P$_{y1}$ etching stop layer 79 is not removed from the above construction. Alternatively, the p-type In$_{x4}$Ga$_{1-x4}$As$_{1-y4}$P$_{y4}$ second upper cladding layer 83 and the p-type GaAs contact layer 84 may be formed after the p-type In$_{x1}$Ga$_{1-x1}$As$_{1-y1}$P$_{y1}$ etching stop layer 79 is removed.

Fifth Embodiment

FIGS. 5A to 5D show cross sections of the representative stages in the process for producing a semiconductor laser device as the fifth embodiment, where the cross sections are perpendicular to the direction of light emitted from the semiconductor laser device.

Figure 5A:
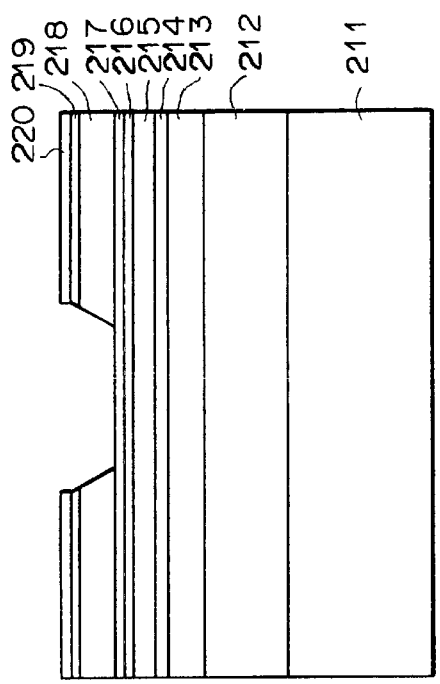
FIGS. 5A to 5D are cross-sectional views of representative stages in the process for producing a semiconductor laser device as the fifth embodiment.

First, as illustrated in FIG. 5A, an n-type In$_{0.49}$Ga$_{0.51}$P lower cladding layer 212, an n-type or i-type In$_{x2}$Ga$_{1-x2}$As$_{1-y2}$P$_{y2}$ optical waveguide layer 213 (x2=(0.49±0.01)y2, 0≦x2≦0.3), an In$_{x3}$Ga$_{1-x3}$As$_{1-y3}$P$_{y3}$ compressive strain quantum well active layer 214 (0<x3≦0.4, 0≦y3≦0.1), a p-type or i-type In$_{x2}$Ga$_{1-x2}$As$_{1-y2}$P$_{y2}$ first upper optical waveguide layer 215, a p-type In$_{x6}$Ga$_{1-x6}$P first etching stop layer 216 (0.2≦x6≦0.8) having a thickness of, for example, about 10 nm, a p-type In$_{x1}$Ga$_{1-x1}$As$_{1-y1}$P$_{y1}$ second etching stop layer 217 (0≦x1≦0.3, 0≦y1≦0.6) having a thickness of, for example, about 10 nm, an n-type In$_{0.49}$Ga$_{0.51}$P current confinement layer 218 having a thickness of, for example, 1 μm, and an n-type GaAs cap layer 219 having a thickness of, for example, about 10 nm are formed on an n-type GaAs substrate 211 by organometallic vapor phase epitaxy. Then, a SiO$_2$ film 220 is formed over the n-type GaAs cap layer 219, and a stripe area having a width of about 3 μm and extending in the <011> direction of the SiO$_2$ film 220 is removed by normal photolithography.

Figure 5B:
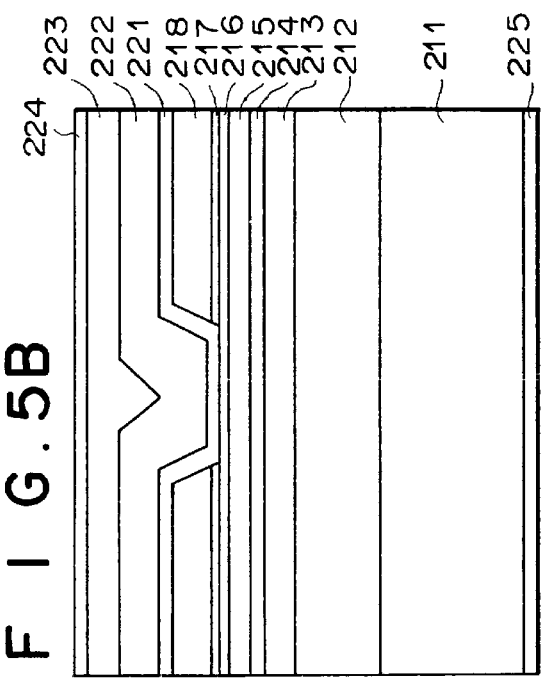

Next, as illustrated in FIG. 5B, the n-type GaAs cap layer 219 is etched with a sulfuric acid etchant by using the SiO$_2$ film 220 as a mask. Then, the exposed area of the n-type In$_{0.49}$Ga$_{0.51}$P current confinement layer 218 is etched with a hydrochloric acid etchant until the p-type In$_{x1}$Ga$_{1-x1}$As$_{1-y1}$P$_{y1}$ second etching stop layer 217 is exposed.

Figure 5C:
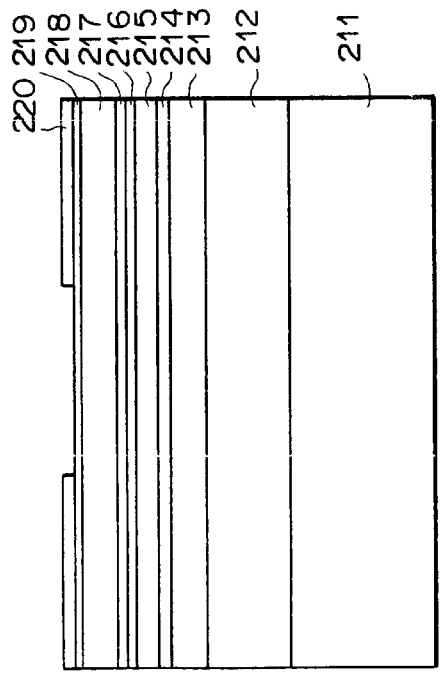

Thereafter, as illustrated in FIG. 5C, the remaining areas of the SiO$_2$, film 220 are removed by etching using a fluoric acid etchant. Then, the n-type GaAs cap layer 219 and the exposed area of the p-type In$_{x1}$Ga$_{1-x1}$As$_{1-y1}$P$_{y1}$ second etching stop layer 217 are removed by etching using a sulfuric acid etchant until the p-type In$_{x6}$Ga$_{1-x6}$P first etching stop layer 216 is exposed.

Figure 5D:
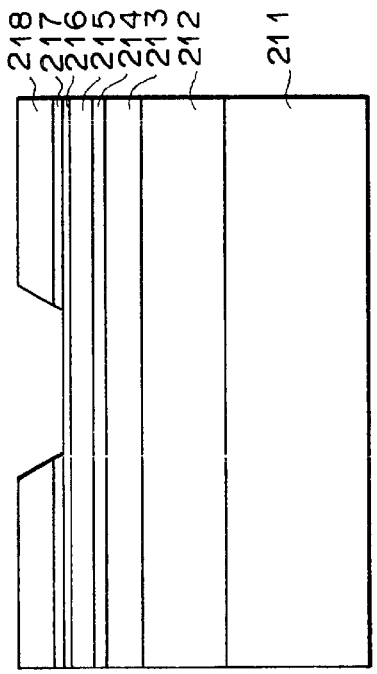

Finally, as illustrated in FIG. 5D, a p-type In$_{x2}$Ga$_{1-x2}$As$_{1-y2}$P$_{y2}$ second upper optical waveguide layer 221 (x2=(0.49±0.01)y2, 0≦x2≦0.3), a p-type In$_{0.49}$Ga$_{0.51}$P upper cladding layer 222, and a p-type GaAs contact layer 223 are formed over the construction of FIG. 5C. Then, a p electrode 224 is formed on the p-type GaAs contact layer 223. In addition, the exposed surface of the substrate 211 is polished, and an n electrode 225 is formed on the polished surface of the substrate 211. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type In$_{x2}$Ga$_{1-x2}$As$_{1-y2}$P$_{y2}$ first upper optical waveguide layer 215 has such a thickness that oscillation in a fundamental transverse mode can be maintained even when output power becomes high.

In addition, in the construction of the fifth embodiment, the n-type GaAs cap layer 219 may be dispensed with.

Sixth Embodiment

FIGS. 6A to 6D show cross sections of the representative stages in the process for producing a semiconductor laser device as the sixth embodiment, where the cross sections are perpendicular to the direction of light emitted from the semiconductor laser device.

Figure 6A:
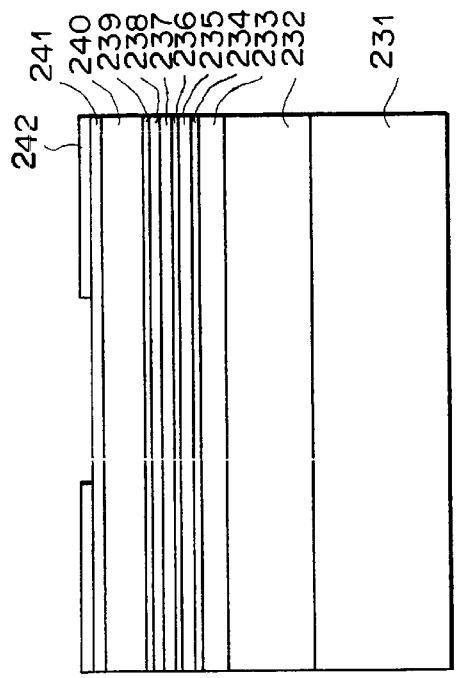
FIGS. 6A to 6D are cross-sectional views of representative stages in the process for producing a semiconductor laser device as the sixth embodiment.

First, as illustrated in FIG. 6A, an n-type In$_{0.49}$Ga$_{0.51}$P lower cladding layer 232, an n-type or i-type In$_{x2}$Ga$_{1-x2}$As$_{1-y2}$P$_{y2}$ optical waveguide layer 233 (x2=(0.49±0.01)y2, 0≦x2≦0.3), an In$_{x5}$Ga$_{1-x5}$As$_{1-y5}$P$_{y5}$ tensile strain barrier layer 234 (0≦x5≦0.3, 0<y5≦0.6), an In$_{x3}$Ga$_{1-x3}$As$_{1-y3}$P$_{y3}$ compressive strain quantum well active layer 235 (0<x3≦0.4, 0≦y3≦0.1), an In$_{x5}$Ga$_{1-x5}$As$_{1-y5}$P$_{y5}$ tensile strain barrier layer 236, a p-type or i-type In$_{x2}$Ga$_{1-x2}$As$_{1-y2}$P$_{y2}$ first upper optical waveguide layer 237, a p-type In$_{x6}$Ga$_{1-x6}$P first etching stop layer 238 (0.2≦x6≦0.8) having a thickness of, for example, 10 nm, an n-type or p-type In$_{x1}$Ga$_{1-x1}$As$_{1-y1}$P$_{y1}$ second etching stop layer 239 (0≦x1≦0.3, 0≦y1≦0.6) having a thickness of, for example, 10 nm, an n-type In$_{0.49}$Ga$_{0.51}$P current confinement layer 240 having a thickness of, for example, 1 μm, and an n-type GaAs cap layer 241 having a thickness of, for example, 10 nm are formed on an n-type GaAs substrate 231 by organometallic vapor phase epitaxy. Then, a SiO$_2$ film 242 is formed over the n-type GaAs cap layer 241, and a stripe area having a width of about 3 μm and extending in the <011> direction of the SiO$_2$ film 242 is removed by normal photolithography.

Figure 6B:
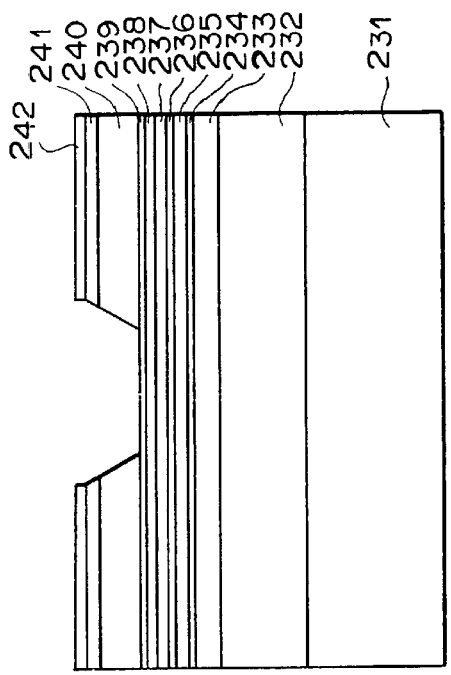

Next, as illustrated in FIG. 6B, the n-type GaAs cap layer 241 is etched with a sulfuric acid etchant by using the SiO$_2$ film 242 as a mask. Then, the exposed area of the n-type In$_{0.49}$Ga$_{0.51}$P current confinement layer 240 is etched with a hydrochloric acid etchant until the n-type or p-type In$_{x1}$Ga$_{1-x1}$As$_{1-y1}$P$_{y1}$ second etching stop layer 239 is exposed.

Figure 6C:
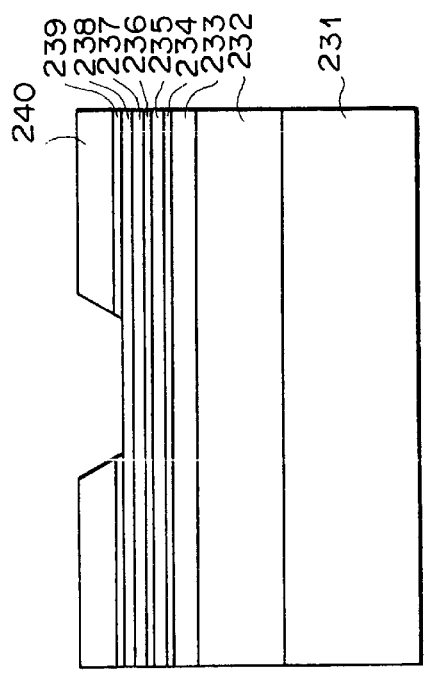

Thereafter, as illustrated in FIG. 6C, the remaining areas of the SiO$_2$ film 242 are removed by etching using a fluoric acid etchant. Then, the n-type GaAs cap layer 241 and the exposed area of the n-type or p-type In$_{x1}$Ga$_{1-x1}$As$_{1-y1}$P$_{y1}$ second etching stop layer 239 are removed by etching using a sulfuric acid etchant until the p-type In$_{x6}$Ga$_{1-x6}$P first etching stop layer 238 is exposed.

Figure 6D:
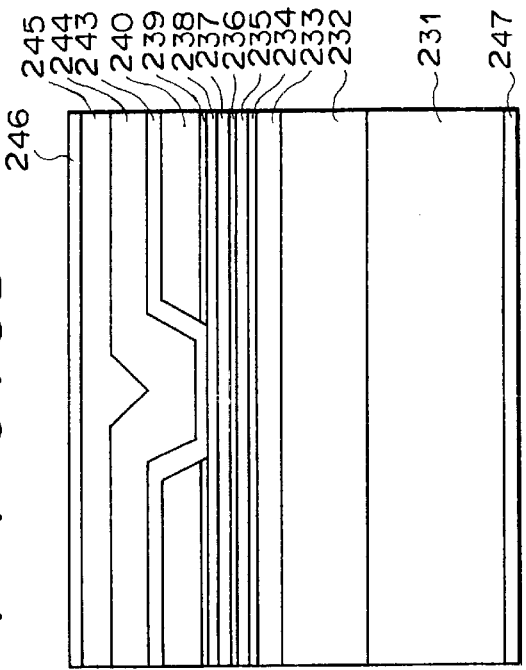

Finally, as illustrated in FIG. 6D, a p-type In$_{x2}$Ga$_{1-x2}$As$_{1-y2}$P$_{y2}$ second upper optical waveguide layer 243 (x2=(0.49±0.01)y2, 0≦x2≦0.3), a p-type In$_{x4}$Ga$_{1-x4}$As$_{1-y4}$P$_{y4}$ upper cladding layer 244 (x4=(0.49±0.01)y4, 0.9≦y4≦1), and a p-type GaAs contact layer 245 are formed over the construction of FIG. 6C. Then, a p electrode 246 is formed on the p-type GaAs contact layer 245. In addition, the exposed surface of the substrate 231 is polished, and an n electrode 247 is formed on the polished surface of the substrate 231. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 237 has such a thickness that oscillation in a fundamental transverse mode can be maintained even when output power becomes high.

In the construction of the sixth embodiment, the compressive strain quantum well active layer is sandwiched between the tensile strain barrier layers. Therefore, compared with the fifth embodiment, characteristics are improved (e.g., the threshold current is lowered), and reliability is increased.

Seventh Embodiment

FIGS. 7A to 7D show cross sections of the representative stages in the process for producing a semiconductor laser device as the seventh embodiment, where the cross sections are perpendicular to the direction of light emitted from the semiconductor laser device.

Figure 7A:
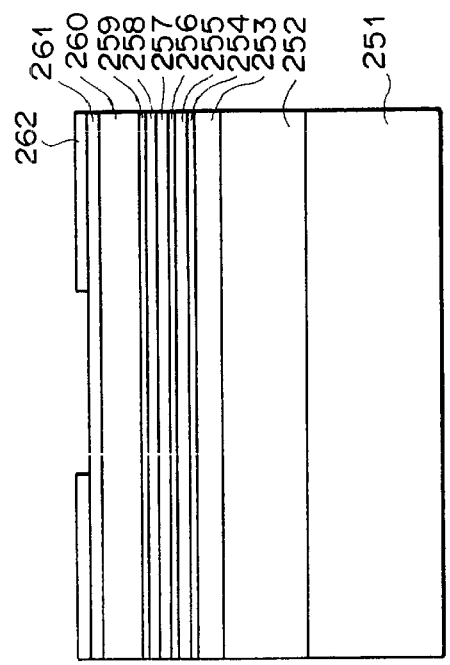
FIGS. 7A to 7D are cross-sectional views of representative stages in the process for producing a semiconductor laser device as the seventh embodiment.

First, as illustrated in FIG. 7A, an n-type $Al_{z1}Ga_{1-z1}As$ lower cladding layer 252 ($0.35 \leq z1 \leq 0.7$), an n-type or i-type $Al_{z2}Ga_{1-z2}As$ optical waveguide layer 253 ($0 \leq z2 \leq 0.2$), an $In_{x5}Ga_{1-x5}As_{1-y5}P_{y5}$ tensile strain barrier layer 254 ($0 \leq x5 \leq 0.3$, $0<y5 \leq 0.6$), an $In_{x3}Ga_{1-x3}As_{1-y3}P_{y3}$ compressive strain quantum well active layer 255 ($0<x3 \leq 0.4$, $0 \leq y3 \leq 0.1$), an $In_{x5}Ga_{1-x5}As_{1-y5}P_{y5}$ tensile strain barrier layer 256, a p-type or i-type $In_{x2}Ga_{1-x2}As_{1-y2}P_{y2}$ first upper optical waveguide layer 257 (x2=(0.49±0.01)y2, $0 \leq x2 \leq 0.3$), a p-type $In_{x6}Ga_{1-x6}P$ first etching stop layer 258 ($0.2 \leq x6 \leq 0.8$) having a thickness of, for example, about 10 nm, an n-type or p-type $In_{x1}Ga_{1-x1}As_{1-y1}P_{y1}$ second etching stop layer 259 ($0 \leq x1 \leq 0.3$, $0 \leq y1 \leq 0.6$) having a thickness of, for example, about 10 nm, an n-type $In_{0.49}Ga_{0.51}P$ current confinement layer 260 having a thickness of, for example, 1 μm, and an n-type GaAs cap layer 261 having a thickness of, for example, 10 nm are formed on an n-type GaAs substrate 251 by organometallic vapor phase epitaxy. Then, a $SiO_2$ film 262 is formed over the n-type GaAs cap layer 261, and a stripe area having a width of about 3 μm and extending in the <011> direction of the $SiO_2$ film 262 is removed by normal photolithography.

Figure 7B:
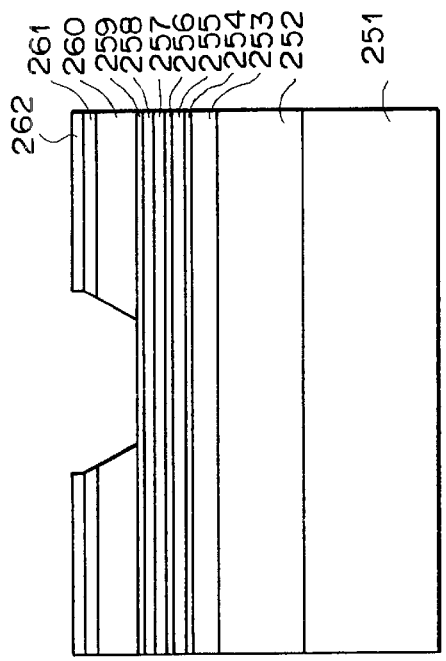

Next, as illustrated in FIG. 7B, the n-type GaAs cap layer 261 is etched with a sulfuric acid etchant by using the $SiO_2$ film 262 as a mask. Then, the exposed area of the n-type $In_{0.49}Ga_{0.51}P$ current confinement layer 260 is etched with a hydrochloric acid etchant until the n-type or p-type $In_{x1}Ga_{1-x1}As_{1-y1}P_{y1}$ second etching stop layer 259 is exposed.

Figure 7C:
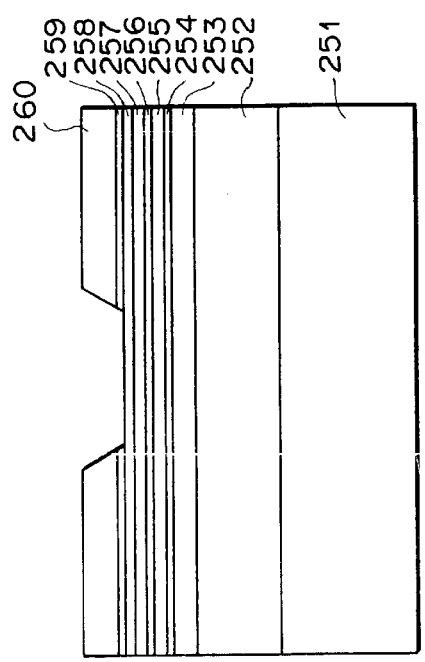

Thereafter, as illustrated in FIG. 7C, the remaining areas of the $SiO_2$ film 262 are removed by etching using a fluoric acid etchant. Then, the n-type GaAs cap layer 261 and the exposed area of the n-type or p-type $In_{x1}Ga_{1-x1}As_{1-y1}P_{y1}$ second etching stop layer 259 are removed by etching using a sulfuric acid etchant until the p-type $In_{x6}Ga_{1-x6}P$ first etching stop layer 258 is exposed.

Figure 7D:
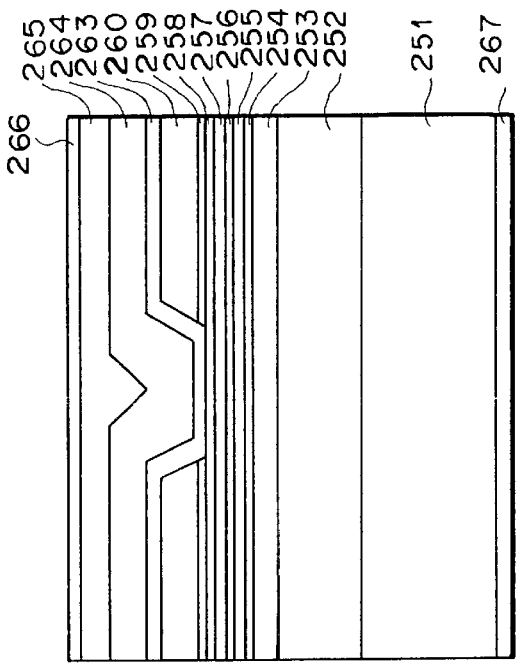

Finally, as illustrated in FIG. 7D, a p-type $In_{x2}Ga_{1-x2}As_{1-y2}P_{y2}$ second upper optical waveguide layer 263 (x2= (0.49±0.01)y2, $0 \leq x2 \leq 0.3$), a p-type $In_{x4}Ga_{1-x4}As_{1-y4}P_{y4}$ upper cladding layer 264 (x4=(0.49±0.01)y4, $0.9 \leq y4 \leq 1$), and a p-type GaAs contact layer 265 are formed over the construction of FIG. 7C. Then, a p electrode 266 is formed on the p-type GaAs contact layer 265. In addition, the exposed surface of the substrate 251 is polished, and an n electrode 267 is formed on the polished surface of the substrate 251. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 257 has such a thickness that oscillation in a fundamental transverse mode can be maintained even when output power becomes high.

Eighth Embodiment

FIGS. 8A to 8D show cross sections of the representative stages in the process for producing a semiconductor laser device as the eighth embodiment, where the cross sections are perpendicular to the direction of light emitted from the semiconductor laser device.

Figure 8A:
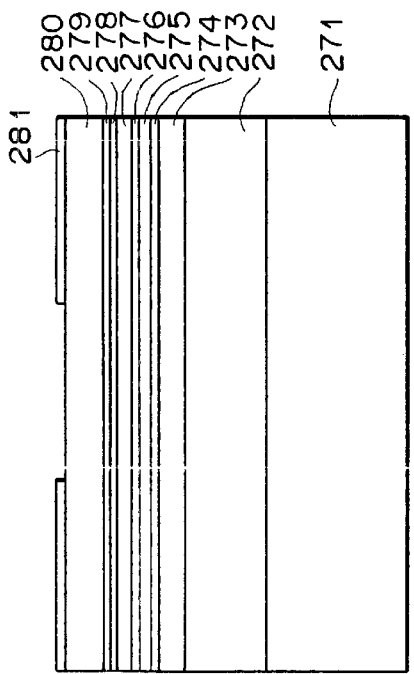
FIGS. 8A to 8D are cross-sectional views of representative stages in the process for producing a semiconductor laser device as the eighth embodiment.

First, as illustrated in FIG. 8A, an n-type $In_{0.49}Ga_{0.51}P$ lower cladding layer 272, an n-type or i-type $In_{x2}Ga_{1-x2}As_{1-y2}P_{y2}$ optical waveguide layer 273 (x2=(0.49±0.01)y2, $0 \leq x2 \leq 0.3$), an $In_{x5}Ga_{1-x5}As_{1-y5}P_{y5}$ tensile strain barrier layer 274 ($0 \leq x5 \leq 0.3$, $0<y5 \leq 0.6$), an $In_{x3}Ga_{1-x3}As_{1-y3}P_{y3}$ compressive strain quantum well active layer 275 ($0<x3 \leq 0.4$, $0 \leq y3 \leq 0.1$), an $In_{x5}Ga_{1-x5}As_{1-y5}P_{y5}$ tensile strain barrier layer 276 ($0 \leq x5 \leq 0.3$, $0<y5 \leq 0.6$), a p-type or i-type $In_{x2}Ga_{1-x2}As_{1-y2}P_{y2}$ first upper optical waveguide layer 277 (x2=(0.49±0.01)y2, $0 \leq x2 \leq 0.3$), a p-type $In_{x6}Ga_{1-x6}P$ first etching stop layer 278 ($0.2 \leq x6 \leq 0.8$) having a thickness of, for example, about 10 nm, an n-type or p-type $In_{x1}Ga_{1-x1}As_{1-y1}P_{y1}$ second etching stop layer 279 ($0 \leq x1 \leq 0.3$, $0 \leq y1 \leq 0.6$) having a thickness of, for example, about 10 nm, and an n-type $In_{0.49}Ga_{0.51}P$ current confinement layer 280 having a thickness of, for example, 1 μm are formed on an n-type GaAs substrate 271 by organometallic vapor phase epitaxy. Then, a $SiO_2$ film 281 is formed over the n-type $In_{0.49}Ga_{0.51}P$ current confinement layer 280, and a stripe area having a width of about 3 μm and extending in the <011> direction of the $SiO_2$ film 281 is removed by normal photolithography.

Figure 8B:
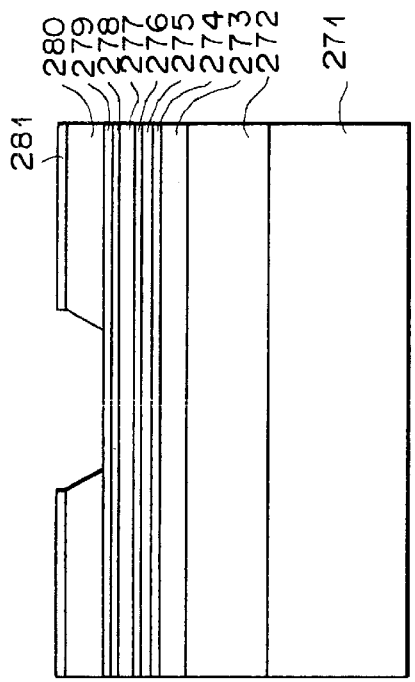

Next, as illustrated in FIG. 8B, the n-type $In_{0.49}Ga_{0.51}P$ current confinement layer 280 is etched with a hydrochloric acid etchant by using the $SiO_2$ film 281 as a mask until the p-type $In_{x1}Ga_{1-x1}As_{1-y1}P_{y1}$ second etching stop layer 279 is exposed.

Figure 8C:
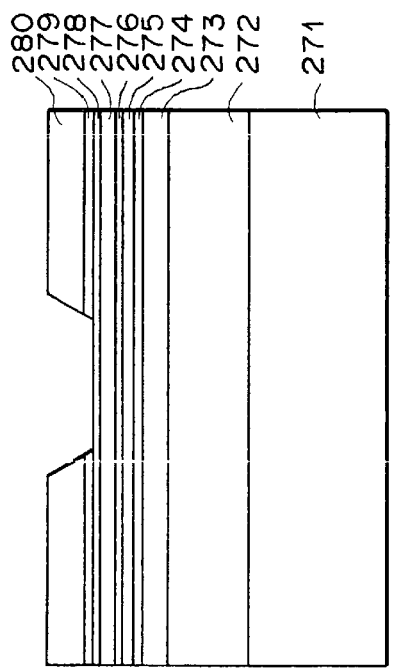

Thereafter, as illustrated in FIG. 8C, the remaining areas of the $SiO_2$ film 281 are removed by etching using a fluoric acid etchant. Then, the exposed area of the p-type $In_{x1}Ga_{1-x1}As_{1-y1}P_{y1}$ second etching stop layer 279 is removed by etching using a sulfuric acid etchant as a mask until the p-type $In_{x6}Ga_{1-x6}P$ first etching stop layer 278 is exposed.

Figure 8D:
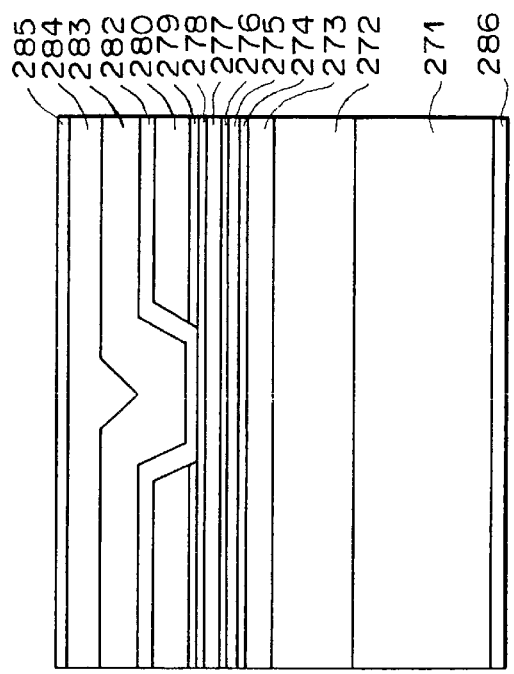

Finally, as illustrated in FIG. 8D, a p-type $In_{x2}Ga_{1-x2}As_{1-y2}P_{y2}$ second upper optical waveguide layer 282 (x2= (0.49±0.01)y2, $0 \leq x2 \leq 0.3$), a p-type $In_{x4}Ga_{1-x4}As_{1-y4}P_{y4}$ upper cladding layer 283 (x4=(0.49±0.01)y4, $0.9 \leq y4 \leq 1$), and a p-type GaAs contact layer 284 are formed over the construction of FIG. 8C. Then, a p electrode 285 is formed on the p-type GaAs contact layer 284. In addition, the exposed surface of the substrate 271 is polished, and an n electrode 286 is formed on the polished surface of the substrate 271. Next, both end surfaces of the layered construction are cleaved, and a high reflectance coating and a low reflectance coating are provided on the respective end surfaces so as to form a resonator. Then, the above construction is formed into a chip of a semiconductor laser device.

In the above construction, the p-type or i-type $In_{x2}Ga_{1-x2}As_{1-y2}P_{y2}$ first upper optical waveguide layer 277 has such a thickness that oscillation in a fundamental transverse mode can be maintained even when output power becomes high.

In the construction of the eighth embodiment, no cap layer is provided. Namely, the semiconductor laser device according to the present invention can be produced without a cap layer.

Additional Matters (i) Due to the $In_{x3}Ga_{1-x3}As_{1-y3}P_{y3}$ compressive strain quantum well active layers ($0<x3\leq0.4$, $0\leq y3\leq0.1$), the oscillation wavelengths of the semiconductor laser devices as the first to eighth embodiments can be controlled in the range of 900 to 1,200 nm.

(ii) The constructions of the first to eighth embodiments can be used not only in index-guided structure semiconductor laser devices, but also in other semiconductor laser devices having a diffraction lattice, as well as in optical integrated circuits.

(iii) Although n-type GaAs substrates are used in the constructions of the first to eighth embodiments, instead, p-type GaAs substrates may be used. When the GaAs substrate is a p-type, the conductivity types of all of the other layers in the constructions of the first to eighth embodiments should be inverted.

(iv) Although the constructions of the first to eighth embodiments have a so-called single-quantum-well separate-confinement heterostructure (SQW-SCH) which includes a single quantum well and an optical waveguide made of a material having a fixed composition, instead, a multiple quantum well structure made of a plurality of quantum wells may be used.

(v) Each layer in the constructions of the first to eighth embodiments may be formed by molecular beam epitaxy using solid or gas raw material.

(vi) The stripe width in the constructions of the first to fourth embodiments may be 1 μm or more.

(vii) The constructions of the fifth to eighth embodiments can be used not only in semiconductor laser devices oscillating in a fundamental transverse mode, but also in wide-stripe index-guided semiconductor laser devices oscillating in multiple modes and having a stripe width of 1 μm or more.

(viii) In addition, all of the contents of the Japanese patent applications Nos. 11(1999)-222168 and 11(1999)-222169 are incorporated into this specification by reference.

What is claimed is:

1. A semiconductor laser device comprising:
a GaAs substrate of a first conductive type;
a lower cladding layer of said first conductive type, formed on said GaAs substrate;
a lower optical waveguide layer formed on said lower cladding layer;
a compressive strain quantum well active layer made of $In_{x3}Ga_{1-x3}As_{1-y3}P_{y3}$, and formed on said lower optical waveguide layer, where $0<x3\leq0.4$, $0\leq y3\leq0.1$, and an absolute value of a first product of a strain and a thickness of said compressive strain quantum well active layer is equal to or smaller than 0.25 nm;
an upper optical waveguide layer formed on said $In_{x3}Ga_{1-x3}As_{1-y3}P_{y3}$ compressive strain quantum well active layer;
a first upper cladding layer made of $In_{0.49}Ga_{0.51}P$ of a second conductive type, and formed on said upper optical waveguide layer;
an etching stop layer made of $In_{x1}Ga_{1-x1}As_{1-y1}P_{y1}$, and formed on said first upper cladding layer other than a stripe area of said first upper cladding layer so as to form a first portion of a stripe groove realizing a current injection window, where $0\leq x1\leq0.3$, $0\leq y1\leq0.6$, and an absolute value of a second product of a strain and a thickness of said etching stop layer is equal to or smaller than 0.25 nm;
a current confinement layer made of $In_{0.49}Ga_{0.51}P$ of said first conductive type, and formed on said etching stop layer so as to form a second portion of said stripe groove;
a second upper cladding layer made of $In_{x4}Ga_{1-x4}As_{1-y4}P_{y4}$ of said second conductive type, and formed on said current confinement layer and said stripe area of the first upper cladding layer, where $x4=(0.49\pm0.01)y4$ and $0.4\leq x4\leq0.46$; and
a contact layer of said second conductive type, formed on said second upper cladding layer;
wherein each of said lower cladding layer, said lower optical waveguide layer, said upper optical waveguide layer, said first upper cladding layer, said current confinement layer, said second upper cladding layer, and said contact layer has such a composition as to lattice-match with said GaAs substrate.

2. A semiconductor laser device according to claim 1, further comprising first and second tensile strain barrier layers, both made of $In_{x5}Ga_{1-x5}As_{1-y5}P_{y5}$, and respectively formed above and below said compressive strain quantum well active layer, where $0\leq x5\leq0.3$ and $0<y5\leq0.6$, and an absolute value of a sum of said first product and a third product of a strain of said first and second tensile strain barrier layers and a total thickness of the first and second tensile strain barrier layers is equal to or smaller than 0.25 nm.

3. A semiconductor laser device according to claim 2, wherein said etching stop layer is one of said first and second conductive types.

4. A semiconductor laser device according to claim 3, wherein said stripe groove has a width equal to or greater than 1 μm.

5. A semiconductor laser device according to claim 4, wherein said compressive strain quantum well active layer includes a plurality of quantum wells.

6. A semiconductor laser device according to claim 3, wherein said compressive strain quantum well active layer includes a plurality of quantum wells.

7. A semiconductor laser device according to claim 2, wherein said stripe groove has a width equal to or greater than 1 μm.

8. A semiconductor laser device according to claim 7, wherein said compressive strain quantum well active layer includes a plurality of quantum wells.

9. A semiconductor laser device according to claim 2, wherein said compressive strain quantum well active layer includes a plurality of quantum wells.

10. A semiconductor laser device according to claim 1, wherein said etching stop layer is one of said first and second conductive types.

11. A semiconductor laser device according to claim 10, wherein said stripe groove has a width equal to or greater than 1 μm.

12. A semiconductor laser device according to claim 11, wherein said compressive strain quantum well active layer includes a plurality of quantum wells.

13. A semiconductor laser device according to claim 10, wherein said compressive strain quantum well active layer includes a plurality of quantum wells.

14. A semiconductor laser device according to claim 1, wherein said stripe groove has a width equal to or greater than 1 μm.

15. A semiconductor laser device according to claim 14, wherein said compressive strain quantum well active layer includes a plurality of quantum wells.

16. A semiconductor laser device according to claim 1, wherein said compressive strain quantum well active layer includes a plurality of quantum wells.

17. A semiconductor laser device comprising:
   a GaAs substrate of a first conductive type;
   a lower cladding layer of said first conductive type, formed on said GaAs substrate;
   a lower optical waveguide layer formed on said lower cladding layer;
   a compressive strain quantum well active layer made of $In_{x3}Ga_{1-x3}As_{1-y3}P_{y3}$, and formed on said lower optical waveguide layer, where $0<x3\leq0.4$, $0\leq y3\leq0.1$, and an absolute value of a first product of a strain and a thickness of said compressive strain quantum well active layer is equal to or smaller than 0.25 nm;
   an upper optical waveguide layer formed on said $In_{x3}Ga_{1-x3}As_{1-y3}P_{y3}$ compressive strain quantum well active layer;
   a first upper cladding layer made of $In_{0.49}Ga_{0.51}P$ of a second conductive type, and formed on said upper optical waveguide layer;
   an etching stop layer made of $In_{x1}Ga_{1-x1}As_{1-y1}P_{y1}$ of said second conductive type, and formed on said first upper cladding layer, where $0\leq x1\leq0.3$, $0\leq y1\leq0.6$, and an absolute value of a second product of a strain and a thickness of said etching stop layer is equal to or smaller than 0.25 nm;
   a current confinement layer made of $In_{0.49}Ga_{0.51}P$ of said first conductive type, and formed on said etching stop layer other than a stripe area of said etching stop layer so as to form a stripe groove realizing a current injection window;
   a second upper cladding layer made of $In_{x4}Ga_{1-x4}As_{1-y4}P_{y4}$ of said second conductive type, and formed on said current confinement layer and said stripe area of the etching stop layer, where $x4=(0.49\pm0.01)y4$ and $0.4\leq x4\leq0.46$; and
   a contact layer of said second conductive type, formed on said second upper cladding layer;
   wherein each of said lower cladding layer, said lower optical waveguide layer, said upper optical waveguide layer, said first upper cladding layer, said current confinement layer, said second upper cladding layer, and said contact layer has such a composition as to lattice-match with said GaAs substrate.

18. A semiconductor laser device according to claim 17, further comprising a first and second tensile strain barrier layers both made of $In_{x5}Ga_{1-x5}As_{1-y5}P_{y5}$, and respectively formed above and below said compressive strain quantum well active layer, where $0\leq x5\leq0.3$ and $0<y5\leq0.6$, and an absolute value of a sum of said first product and a third product of a strain of said first and second tensile strain barrier layers and a total thickness of the first and second tensile strain barrier layers is equal to or smaller than 0.25 nm.

19. A semiconductor laser device according to claim 18, wherein said stripe groove has a width equal to or greater than 1 μm.

20. A semiconductor laser device according to claim 19, wherein said compressive strain quantum well active layer includes a plurality of quantum wells.

21. A semiconductor laser device according to claim 18, wherein said compressive strain quantum well active layer includes a plurality of quantum wells.

22. A semiconductor laser device according to claim 17, wherein said stripe groove has a width equal to or greater than 1 μm.

23. A semiconductor laser device according to claim 22, wherein said compressive strain quantum well active layer includes a plurality of quantum wells.

24. A semiconductor laser device according to claim 17, wherein said compressive strain quantum well active layer includes a plurality of quantum wells.

25. A process for producing a semiconductor laser device, comprising the steps of:
   (a) forming a lower cladding layer of a first conductive type on a GaAs substrate of the first conductive type;
   (b) forming a lower optical waveguide layer on said lower cladding layer;
   (c) forming a compressive strain quantum well active layer made of $In_{x3}Ga_{1-x3}As_{1-y3}P_{y3}$, on said lower optical waveguide layer, where $0<x3\leq0.4$, $0\leq y3\leq0.1$, and an absolute value of a first product of a strain and a thickness of said compressive strain quantum well active layer is equal to or smaller than 0.25 nm;
   (d) forming an upper optical waveguide layer on said $In_{x3}Ga_{1-x3}As_{1-y3}P_{y3}$ compressive strain quantum well active layer;
   (e) forming a first upper cladding layer made of $In_{0.49}Ga_{0.51}P$ of a second conductive type, on said upper optical waveguide layer;
   (f) forming an etching stop layer made of $In_{x1}Ga_{1-x1}As_{1-y1}P_{y1}$, on said first upper cladding layer, where $0\leq x1\leq0.3$ and $0\leq y1\leq0.6$, and an absolute value of a second product of a strain and a thickness of said etching stop layer is equal to or smaller than 0.25 nm;
   (g) forming a current confinement layer made of $In_{0.49}Ga_{0.51}P$ of the first conductive type, on said etching stop layer;
   (h) removing a stripe area of said current confinement layer so as to form a stripe groove for realizing a current injection window;
   (i) forming a second upper cladding layer made of $In_{x4}Ga_{1-x4}As_{1-y4}P_{y4}$ of the second conductive type so that said stripe groove is covered with the second upper cladding layer, where $x4=(0.49\pm0.01)y4$ and $0.4\leq x4\leq0.46$; and
   (j) forming a contact layer of said second conductive type, on said second upper cladding layer;
   wherein each of said lower cladding layer, said lower optical waveguide layer, said upper optical waveguide layer, said first upper cladding layer, said current confinement layer, said second upper cladding layer, and said contact layer has such a composition as to lattice-match with said GaAs substrate.

26. A process according to claim 25, further comprising the steps of,
   (b1) after said step (b), forming a first tensile strain barrier layer made of $In_{x5}Ga_{1-x5}As_{1-y5}P_{y5}$, on said lower optical waveguide layer, where $0\leq x5\leq0.3$ and $0<y5\leq0.6$, and (c1) after said step (c), forming a second tensile strain barrier layer made of $In_{x5}Ga_{1-x5}As_{1-y5}P_{y5}$, on said compressive strain quantum well active layer, where an absolute value of a sum of said first product and a third product of a strain of said first and second tensile strain barrier layers and a total thickness of the first and second tensile strain barrier layers is equal to or smaller than 0.25 nm.

27. A process according to claim 26, further comprising, after said step (g), the steps of, (g1) forming a cap layer made of GaAs, and (g2) removing a stripe area of said cap layer; and said process further comprising, after said step (h), the step of, (h1) removing a remaining area of said cap layer and a stripe area of said etching stop layer so as to form an additional portion of said stripe groove.

28. A process according to claim 27, wherein said cap layer is one of said first and second conductive types.

29. A process according to claim 28, wherein said etching stop layer is one of said first and second conductive types.

30. A process according to claim 27, wherein said etching stop layer is one of said first and second conductive types.

31. A process according to claim 26, wherein said etching stop layer is one of said first and second conductive types.

32. A process according to claim 25, further comprising, after said step (g), the steps of, (g1) forming a cap layer made of GaAs, and (g2) removing a stripe area of said cap layer; and said process further comprising, after said step (h), the step of, (h1) removing a remaining area of said cap layer and a stripe area of said etching stop layer so as to form an additional portion of said stripe groove.

33. A process according to claim 32, wherein said cap layer is one of said first and second conductive types.

34. A process according to claim 33, wherein said etching stop layer is one of said first and second conductive types.

35. A process according to claim 32, wherein said etching stop layer is one of said first and second conductive types.

36. A process according to claim 25, wherein said etching stop layer is one of said first and second conductive types.

37. A semiconductor laser device comprising:

a GaAs substrate of a first conductive type;

a lower cladding layer of said first conductive type, formed on said GaAs substrate;

a lower optical waveguide layer, formed on said lower cladding layer;

a compressive strain quantum well active layer made of $In_{x3}Ga_{1-x3}As_{1-y3}P_{y3}$ and formed on said lower optical waveguide layer, where $0<x3\leq0.4$ and $0\leq y3\leq0.1$;

a first upper optical waveguide layer made of $In_{x2}Ga_{1-x2}As_{1-y2}P_{y2}$, and formed on said $In_{x3}Ga_{1-x3}As_{1-y3}P_{y3}$ compressive strain quantum well active layer, where $x2=(0.49\pm0.01)y2$ and $0\leq x2\leq0.3$;

a first etching stop layer made of $In_{x6}Ga_{1-x6}P$ of a second conductive type, and formed on said first upper optical waveguide layer, where $0.2\leq x6\leq0.8$;

a second etching stop layer made of $In_{x1}Ga_{1-x1}As_{1-y1}P_{y1}$, and formed on said first etching stop layer other than a stripe area of the first etching stop layer so as to form a first portion of a stripe groove realizing a current injection window, where $0\leq x1\leq0.3$ and $0\leq y1\leq0.6$;

a current confinement layer made of $In_{0.49}Ga_{0.51}P$ of the first conductive type, and formed on said second etching stop layer so as to form a second portion of said stripe groove;

a second upper optical waveguide layer made of $In_{x2}Ga_{1-x2}As_{1-y2}P_{y2}$ of said second conductive type so as to cover said stripe groove, where $x2=(0.49\pm0.01)y2$ and $0\leq x2\leq0.3$;

an upper cladding layer made of $In_{x4}Ga_{1-x4}As_{1-y4}P_{y4}$ of said second conductive type, and formed over said second upper optical waveguide layer, where $x4=(0.49\pm0.01)y4$ and $0.9\leq y4\leq1$; and a contact layer of said second conductive type, formed on said upper cladding layer;

wherein an absolute value of a first product of a strain and a thickness of said compressive strain quantum well active layer is equal to or smaller than 0.25 nm, an absolute value of a sum of a second product and a third product is equal to or smaller than 0.25 nm, where said second product is a product of a strain and a thickness of said first etching stop layer, and said third product is a product of a strain and a thickness of said second etching stop layer, and each of said lower cladding layer, said lower optical waveguide layer, said first and second upper optical waveguide layers, said current confinement layer, said upper cladding layer, and said contact layer has such a composition as to lattice-match with said GaAs substrate.

38. A semiconductor laser device according to claim 37, further comprising first and second tensile strain barrier layers both made of $In_{x5}Ga_{1-x5}As_{1-y5}P_{y5}$, and respectively formed above and below said compressive strain quantum well active layer, where $0\leq x5\leq0.3$ and $0<y5\leq0.6$, and an absolute value of a sum of said first product and a fourth product of a strain of said first and second tensile strain barrier layers and a total thickness of the first and second tensile strain barrier layers is equal to or smaller than 0.25 nm.

39. A semiconductor laser device according to claim 38, wherein said second etching stop layer is one of said first and second conductive types.

40. A semiconductor laser device according to claim 39, wherein said stripe groove has a width equal to or greater than 1 $\mu$m.

41. A semiconductor laser device according to claim 40, wherein said compressive strain quantum well active layer includes a plurality of quantum wells.

42. A semiconductor laser device according to claim 39, wherein said compressive strain quantum well active layer includes a plurality of quantum wells.

43. A semiconductor laser device according to claim 38, wherein said stripe groove has a width equal to or greater than 1 $\mu$m.

44. A semiconductor laser device according to claim 43, wherein said compressive strain quantum well active layer includes a plurality of quantum wells.

45. A semiconductor laser device according to claim 38, wherein said compressive strain quantum well active layer includes a plurality of quantum wells.

46. A semiconductor laser device according to claim 37, wherein said second etching stop layer is one of said first and second conductive types.

47. A semiconductor laser device according to claim 46, wherein said stripe groove has a width equal to or greater than 1 $\mu$m.

48. A semiconductor laser device according to claim 47, wherein said compressive strain quantum well active layer includes a plurality of quantum wells.

49. A semiconductor laser device according to claim 46, wherein said compressive strain quantum well active layer includes a plurality of quantum wells.

50. A semiconductor laser device according to claim 37, wherein said stripe groove has a width equal to or greater than 1 µm.

51. A semiconductor laser device according to claim 50, wherein said compressive strain quantum well active layer includes a plurality of quantum wells.

52. A semiconductor laser device according to claim 37, wherein said compressive strain quantum well active layer includes a plurality of quantum wells.

53. A process for producing a semiconductor laser device, comprising the steps of:
  (a) forming a lower cladding layer of a first conductive type on a GaAs substrate of the first conductive type;
  (b) forming a lower optical waveguide layer on said lower cladding layer;
  (c) forming a compressive strain quantum well active layer made of $In_{x3}Ga_{1-x3}As_{1-y3}P_{y3}$, on said lower optical waveguide layer, where $0<x3\leq0.4$, $0\leq y3\leq0.1$, and an absolute value of a first product of a strain and a thickness of said compressive strain quantum well active layer is equal to or smaller than 0.25 nm;
  (d) forming a first upper optical waveguide layer made of $In_{x2}Ga_{1-x2}As_{1-y2}P_{y2}$, on said $In_{x3}Ga_{1-x3}As_{1-y3}P_{y3}$ compressive strain quantum well active layer, where $x2=(0.49\pm0.01)y2$ and $0\leq x2\leq0.3$;
  (e) forming a first etching stop layer made of $In_{x6}Ga_{1-x6}P$ of a second conductive type, on said first upper optical waveguide layer, where $0.2\leq x6\leq0.8$;
  (f) forming a second etching stop layer made of $In_{x1}Ga_{1-x1}As_{1-y1}P_{y1}$, on said first upper cladding layer, where $0\leq x1\leq0.3$ and $0\leq y1\leq0.6$;
  (g) forming a current confinement layer made of $In_{0.49}Ga_{0.51}P$ of the first conductive type, on said second etching stop layer;
  (h) removing a stripe area of said current confinement layer and a stripe area of said second etching stop layer so as to form a stripe groove realizing a current injection window;
  (i) forming a second upper optical waveguide layer made of $In_{x2}Ga_{1-x2}As_{1-y2}P_{y2}$ of the second conductive type, so as to cover said stripe groove, where $x2=(0.49\pm0.01)y2$ and $0\leq x2\leq0.3$;
  (j) forming an upper cladding layer made of $In_{x4}Ga_{1-x4}As_{1-y4}P_{y4}$ of the second conductive type, over said second upper optical waveguide layer, where $x4=(0.49\pm0.01)y4$ and $0.9\leq y4\leq1$;
  (k) forming a contact layer of said second conductive type, on said second upper cladding layer;
  wherein an absolute value of a sum of a second product and a third product is equal to or smaller than 0.25 nm, where said second product is a product of a strain and a thickness of said first etching stop layer, and said third product is a product of a strain and a thickness of said second etching stop layer, and each of said lower cladding layer, said lower optical waveguide layer, said first and second upper optical waveguide layers, said current confinement layer, said upper cladding layer, and said contact layer has such a composition as to lattice-match with said GaAs substrate.

54. A process according to claim 53, further comprising the steps of,
  (b1) after said step (b), forming a first tensile strain barrier layer made of $In_{x5}Ga_{1-x5}As_{1-y5}P_{y5}$, on said lower optical waveguide layer, where $0\leq x5\leq0.3$ and $0<y5\leq0.6$, and
  (c1) after said step (c), forming a second tensile strain barrier layer made of $In_{x5}Ga_{1-x5}As_{1-y5}P_{y5}$, on said compressive strain quantum well active layer,
  where an absolute value of a sum of said first product and a fourth product of a strain of said first and second tensile strain barrier layers and a total thickness of the first and second tensile strain barrier layers is equal to or smaller than 0.25 nm.

55. A process according to claim 54, further comprising, after said step (g), the step of (g1) forming a cap layer made of GaAs, and
  said step (h) comprising the substeps of,
  (h1) removing a stripe area of said cap layer and said stripe area of said current confinement layer, and
  (h2) removing a remaining area of said cap layer and said stripe area of said second etching stop layer.

56. A process according to claim 55, wherein said second etching stop layer is one of said first and second conductive types.

57. A process according to claim 56, wherein said cap layer is one of said first and second conductive types.

58. A process according to claim 55, wherein said cap layer is one of said first and second conductive types.

59. A process according to claim 54, wherein said second etching stop layer is one of said first and second conductive types.

60. A process according to claim 53, further comprising, after said step (g), the step of (g1) forming a cap layer made of GaAs, and
  said step (h) comprising the substeps of,
  (h1) removing a stripe area of said cap layer and said stripe area of said current confinement layer, and
  (h2) removing a remaining area of said cap layer and said stripe area of said second etching stop layer.

61. A process according to claim 60, wherein said second etching stop layer is one of said first and second conductive types.

62. A process according to claim 61, wherein said cap layer is one of said first and second conductive types.

63. A process according to claim 60, wherein said cap layer is one of said first and second conductive types.

64. A process according to claim 53, wherein said second etching stop layer is one of said first and second conductive types.

* * * * *